United States Patent
Nomura et al.

(10) Patent No.: US 8,223,531 B2
(45) Date of Patent: Jul. 17, 2012

(54) SEMICONDUCTOR DEVICE AND DRIVING METHOD OF THE SAME

(75) Inventors: Ryoji Nomura, Yamato (JP); Hiroko Abe, Setagaya (JP); Yuji Iwaki, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/151,299

(22) Filed: Jun. 2, 2011

(65) Prior Publication Data

US 2011/0227137 A1  Sep. 22, 2011

Related U.S. Application Data

(63) Continuation of application No. 12/349,650, filed on Jan. 7, 2009, which is a continuation of application No. 11/547,304, filed as application No. PCT/JP2005/019156 on Oct. 12, 2005, now Pat. No. 7,499,305.

(30) Foreign Application Priority Data

Oct. 18, 2004  (JP) ................................ 2004-303595

(51) Int. Cl.
*G11C 7/10* (2006.01)
(52) U.S. Cl. ........................................ 365/148; 365/163
(58) Field of Classification Search .................. 365/148, 365/163
See application file for complete search history.

(56) References Cited

U.S. PATENT DOCUMENTS

| | | | |
|---|---|---|---|
| 3,833,894 A | 9/1974 | Aviram et al. | |
| 5,375,250 A | 12/1994 | Van den Heuvel | |
| 5,528,222 A | 6/1996 | Moskowitz et al. | |
| 6,055,180 A | 4/2000 | Gudesen et al. | |
| 6,337,492 B1 * | 1/2002 | Jones et al. | ..... 257/40 |
| 6,340,588 B1 | 1/2002 | Nova et al. | |
| 6,396,208 B1 * | 5/2002 | Oda et al. | ..... 313/504 |
| 6,478,229 B1 | 11/2002 | Epstein | |
| 6,528,815 B1 | 3/2003 | Brown et al. | |

(Continued)

FOREIGN PATENT DOCUMENTS

EP  0855675 A2  7/1998

(Continued)

OTHER PUBLICATIONS

Elsharkawi.A et al., "Technical Note switching and memory phenomena in anthracene thin films,", J. Phys. Chem. Solids (Journal of Physics and Chemistry of Solids), 1977, vol. 38, pp. 95-96.

(Continued)

*Primary Examiner* — Michael Tran
(74) *Attorney, Agent, or Firm* — Eric J. Robinson; Robinson Intellectual Property Law Office, P.C.

(57) ABSTRACT

The present invention provides a semiconductor device including a memory that has a memory cell array including a plurality of memory cells, a control circuit that controls the memory, and an antenna, where the memory cell array has a plurality of bit lines extending in a first direction and a plurality of word lines extending in a second direction different from the first direction, and each of the plurality of memory cells has an organic compound layer provided between the bit line and the word line. Data is written by applying optical or electric action to the organic compound layer.

39 Claims, 31 Drawing Sheets

U.S. PATENT DOCUMENTS

| | | | |
|---|---|---|---|
| 6,552,409 B2 | 4/2003 | Taussig et al. | |
| 6,646,912 B2 | 11/2003 | Hurst et al. | |
| 6,683,322 B2 | 1/2004 | Jackson et al. | |
| 6,683,802 B2 | 1/2004 | Katoh | |
| 6,781,166 B2 | 8/2004 | Lieber et al. | |
| 6,784,017 B2 | 8/2004 | Yang et al. | |
| 6,809,952 B2 | 10/2004 | Masui | |
| 6,813,182 B2 | 11/2004 | Perlov et al. | |
| 6,847,047 B2 | 1/2005 | Van Buskirk et al. | |
| 6,870,183 B2 | 3/2005 | Tripsas et al. | |
| 6,872,472 B2 * | 3/2005 | Liao et al. | 428/690 |
| 6,903,397 B2 | 6/2005 | Asakawa | |
| 6,903,958 B2 | 6/2005 | Bernds et al. | |
| 6,947,321 B2 | 9/2005 | Tanabe | |
| 6,950,331 B2 | 9/2005 | Yang | |
| 6,963,307 B2 | 11/2005 | Mohamadi | |
| 6,977,389 B2 | 12/2005 | Tripsas et al. | |
| 6,979,837 B2 | 12/2005 | Tripsas et al. | |
| 7,050,326 B2 | 5/2006 | Anthony | |
| 7,051,945 B2 | 5/2006 | Empedocles et al. | |
| 7,172,953 B2 | 2/2007 | Lieber et al. | |
| 7,204,425 B2 | 4/2007 | Mosher, Jr. et al. | |
| 7,220,985 B2 | 5/2007 | Cheung et al. | |
| 7,358,848 B2 | 4/2008 | Mohamadi | |
| 7,359,230 B2 | 4/2008 | Sumida et al. | |
| 7,399,691 B2 | 7/2008 | Lieber et al. | |
| 7,465,956 B1 | 12/2008 | Tripsas et al. | |
| 7,518,692 B2 | 4/2009 | Yamazaki et al. | |
| 7,688,624 B2 | 3/2010 | Abe et al. | |
| 7,781,758 B2 | 8/2010 | Abe et al. | |
| 8,003,436 B2 | 8/2011 | Tripsas et al. | |
| 2002/0005827 A1 | 1/2002 | Kobayashi | |
| 2003/0223270 A1 | 12/2003 | Perlov et al. | |
| 2004/0095256 A1 | 5/2004 | Mohamadi | |
| 2004/0100817 A1 | 5/2004 | Subramanian et al. | |
| 2004/0108501 A1 | 6/2004 | Cheung et al. | |
| 2004/0112964 A1 | 6/2004 | Empedocles et al. | |
| 2004/0145425 A1 * | 7/2004 | Grebenkemper | 333/12 |
| 2004/0160170 A1 * | 8/2004 | Sato et al. | 313/504 |
| 2004/0164302 A1 | 8/2004 | Arai et al. | |
| 2004/0188721 A1 | 9/2004 | Lieber et al. | |
| 2004/0259359 A1 * | 12/2004 | Chang et al. | 438/689 |
| 2005/0174875 A1 | 8/2005 | Katoh | |
| 2006/0267068 A1 | 11/2006 | Sato et al. | |
| 2007/0194301 A1 | 8/2007 | Sezi et al. | |

FOREIGN PATENT DOCUMENTS

| | | | |
|---|---|---|---|
| EP | 1265286 A | | 12/2002 |
| EP | 1265287 A | | 12/2002 |
| EP | 1 341 186 | | 9/2003 |
| EP | 1367596 A | | 12/2003 |
| EP | 1381054 A | | 1/2004 |
| EP | 1437683 A | | 7/2004 |
| EP | 1 453 088 | | 9/2004 |
| EP | 2224508 A | | 9/2010 |
| EP | 2239794 A | | 10/2010 |
| JP | 02-239664 A | | 9/1990 |
| JP | 11-504749 | | 4/1999 |
| JP | 2001-345431 | | 12/2001 |
| JP | 2003-007977 A | | 1/2003 |
| JP | 2003-036684 A | | 2/2003 |
| JP | 2004-509458 | | 3/2004 |
| JP | 2004-220591 A | | 8/2004 |
| KR | 10-0191975 B1 | | 6/1999 |
| KR | 2001-0013926 A | | 2/2001 |
| WO | 96/07985 | | 3/1996 |
| WO | WO-97/30445 | | 8/1997 |
| WO | WO-98/58383 | | 12/1998 |
| WO | WO-01/03208 | | 1/2001 |
| WO | WO 02/37500 | | 5/2002 |
| WO | WO 2004/015778 | | 2/2004 |
| WO | WO-2004/042737 | | 5/2004 |
| WO | WO 2005/096380 | | 10/2005 |
| WO | WO 2006/043611 | | 4/2006 |
| WO | WO 2006/043687 | | 4/2006 |

OTHER PUBLICATIONS

European Office Action (Application No. 05795303.6) Dated May 25, 2011.
European Search Report (Application No. 11001461.0) Dated May 30, 2011.
International Search Report (Application No. PCT/JP2005/019156) dated Jan. 31, 2006.
Written Opinion (Application No. PCT/JP2005/019156) dated Jan. 31, 2006.
Robert Lemos, "RFID Tags Become Easy Target for Hacker," http://japan.cnet.com/newa/sec/story/0,2000056024,20070122,00.htm, 2 pages, Jul. 29, 2004.
Search Report (Application No. 05795303.6) dated Nov. 10, 2008.
European Patent Office Action (Application No. 05 795 303.6) dated Jun. 11, 2010.
Chinese Office Action (Application No. 200910173652.4) Dated Jun. 21, 2011.
Korean Office Action (Application No. 2011-7025808) dated Jan. 5, 2012.
Taiwanese Office Action (Application No. 094136342) Dated Mar. 6, 2012.
Korean Office Action (Application No. 2012-7005780) Dated Apr. 30, 2012.

* cited by examiner

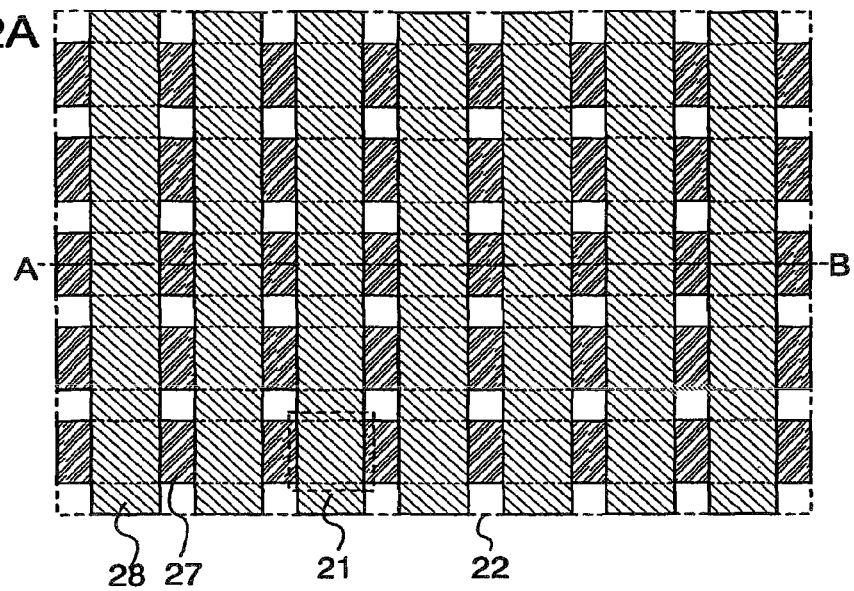
FIG. 2A
FIG. 2B
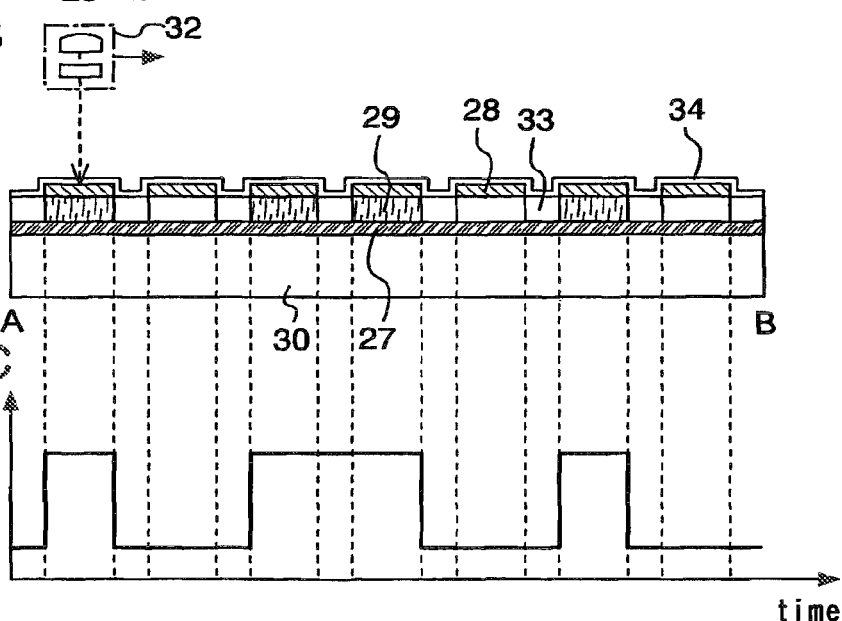
FIG. 2C
FIG. 2D
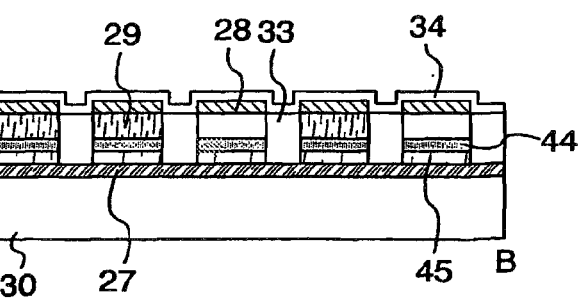

499 μm

6001

○ : before short circuiting      □ : after short circuiting

○ : before short circuiting    □ : after short circuiting

○ : before short circuiting      □ : after short circuiting

FIG. 31

|  | writing voltage(V) | R(1V) | R(3V) |
|---|---|---|---|
| sample 1 | 8.4 | 1.9E+07 | 8.4E+03 |
| sample 2 | 4.4 | 8.0E+08 | 2.1E+02 |
| sample 3 | 3.2 | 8.7E+04 | 2.0E+02 |
| sample 4 | 5.0 | 3.7E+04 | 1.0E+01 |
| sample 5 | 6.1 | 2.0E+05 | 5.9E+01 |
| sample 6 | 7.8 | 2.0E+04 | 2.5E+02 |

SEMICONDUCTOR DEVICE AND DRIVING METHOD OF THE SAME

TECHNICAL FIELD

The present invention relates to a semiconductor device and a method for driving the semiconductor device.

BACKGROUND ART

In recent years, individual recognition technology has gotten a lot of attention. For example, there is a technology to be used for production and management, in which information such as a history of the object is clarified by giving an ID (an individual recognition number) to an individual object. Above all, the development of semiconductor devices that send and receive data without contact by using an electromagnetic field or a radio wave have been advanced. As such semiconductor devices, in particular, a wireless chip (also referred to as an ID tag, an IC tag, and IC chip, an RF (Radio Frequency) tag, a wireless tag, an electronic tag, or an RFID (Radio Frequency Identification)) is beginning to be introduced into companies, markets, and the like.

Many of semiconductor devices that have been already been put to practical use have a circuit using a semiconductor substrate (also referred to as an IC (Integrated Circuit) chip) and an antenna; and the IC chip includes a memory and a control circuit.

In addition, depending on the structure of a memory provided in the IC chip, ways such as writing or reading of information are classified into various methods. For example, in the case of using a mask ROM for a memory circuit, no writing of data can be carried out other than in manufacturing the chip. In this case, no writing of data can be carried out other than in manufacturing the chip, and the chip is thus not user-friendly. Therefore, an ID chip in which data can be written other than in manufacturing the chip has been needed.

On the other hand, in the case of using an EEPROM or the like for a memory circuit, while a user can freely rewrite the content, some one other than the user is allowed to rewrite the information so that falsification is possible (for example, Non-Patent Document 1). Therefore, security measures are not implemented sufficiently now, and thus, measures that are able to prevent falsification by rewriting or the like have been needed.

In addition, an element has been needed, and active research and development are carried out actively.
(Non-Patent Document 1)
http://japan.cnet.com/news/sec/story/0,2000050480,
   20070122,00.htm

DISCLOSURE OF INVENTION

It is an object of the present invention to provide a semiconductor device in which data can be written other than in manufacturing the semiconductor device and falsification by rewriting can be prevented. Further, it is an object of the present invention to an inexpensive semiconductor device that is easily formed and includes a memory element and a method for driving the semiconductor device.

In order to achieve the objects, the present invention provides the following.

A semiconductor device according to the present invention includes a plurality of bit lines extending in a first direction, a plurality of word lines extending in a second direction that is different from the first direction, a memory cell array comprising a plurality of memory cells provided at an intersecting portion of the bit line and the word line, and an organic memory element provided in the memory cell, where the organic memory element has a laminated structure of the bit line, an organic compound layer, and the word line.

Further, another semiconductor device according to the present invention includes a plurality of bit lines extending in a first direction, a plurality of word lines extending in a second direction that is different from the first direction, a memory cell array comprising a plurality of memory cells provided at an intersecting portion of the bit line and the word line, an organic memory element provided in the memory cell, and an antenna, where the organic memory element has a laminated structure of the bit line, an organic compound layer, and the word line.

In addition, in each of the semiconductor devices according to the present invention, at least one of the bit line and the word line is a light-transmitting property.

Further, another semiconductor device according to the present invention includes a plurality of bit lines extending in a first direction, a plurality of word lines extending in a second direction that is different from the first direction, and a memory cell array comprising a plurality of memory cells surrounded by the bit lines and the word lines, wherein the memory cell includes a transistor and an organic memory element electrically connected to the transistor, and wherein the organic memory element has an organic compound layer provided between a pair of conductive layers.

Further, another semiconductor device according to the present invention includes a plurality of bit lines extending in a first direction, a plurality of word lines extending in a second direction that is different from the first direction, a memory cell array comprising a plurality of memory cells surrounded by the bit lines and the word fines, and an antenna, wherein the memory cell includes a transistor and an organic memory element electrically connected to the transistor, and wherein the organic memory element has an organic compound layer provided between a pair of conductive layers.

In addition, in each of the semiconductor devices according to the present invention, at least one of the pair of conductive layers is a light-transmitting property.

In addition, in each of the semiconductor devices according to the present invention, the organic memory element has a resistance irreversibly changed by writing.

In addition, in each of the semiconductor devices according to the present invention, a distance between the electrodes of the organic memory element is changed by writing.

In addition, in each of the semiconductor devices according to the present invention, the organic compound layer comprises one of an electron transporting material and a hole transporting material.

In addition, in each of the semiconductor devices according to the present invention, the organic compound layer has an electric conductivity that is $10^{-15}$ S/cm or more and $10^{-3}$ S/cm or less.

In addition, in each of the semiconductor devices according to the present invention, the organic compound layer has a film thickness of 5 to 60 nm.

A method for driving a semiconductor device according to the present invention, where the semiconductor device comprises a plurality of bit lines extending in a first direction, a plurality of word lines extending in a second direction that is different from the first direction, a memory cell array comprising a plurality of memory cells provided at an intersecting portion of the bit line and the word line, and an organic memory element provided in the memory cell, where the organic memory element comprises an organic compound layer provided between the bit line and the wad line, where writing of data is carried out by applying a voltage between the bit line and the word line to change an electric resistance of the organic memory element, and where reading of data is carried out by applying a voltage between the bit line and the word line to read the electric resistance of the organic memory element.

Another method for driving a semiconductor device according to the present invention, where the semiconductor device comprises a plurality of bit lines extending in a first direction, a plurality of word lines extending in a second direction that is different from the first direction, and a memory cell array comprising a plurality of memory cells surrounded by the bit lines and the word lines, where the organic memory element comprises an organic compound layer provided between a pair of electrodes, where writing of data is carried out by applying a voltage between the pair of electrodes to change an electric resistance of the organic memory element, and where reading of data is carried out by applying a voltage between the pair of electrodes to read the electric resistance of the organic memory element.

In accordance with the present invention, it is possible to obtain a semiconductor device in which data can be written (write once read many) other than in manufacturing the semiconductor device and falsification by rewriting can be prevented. Further, it is possible to provide an inexpensive semiconductor device and a method for driving the semiconductor device by providing a memory using an organic compound that is easily deposited as a material or a semiconductor device including the memory.

Furthermore, it is possible to provide a semiconductor device including a memory element in which data can be written with small power.

BRIEF DESCRIPTION OF DRAWINGS

In the accompanying drawings:

FIGS. 2A to 2D are diagrams illustrating a semiconductor device according to the present invention and a method for driving the semiconductor device;

FIG. 31 is a diagram showing writing voltages and characteristics before and after writing of the samples 1 to 6.

BEST MODE FOR CARRYING OUT THE INVENTION

Figure 1A:
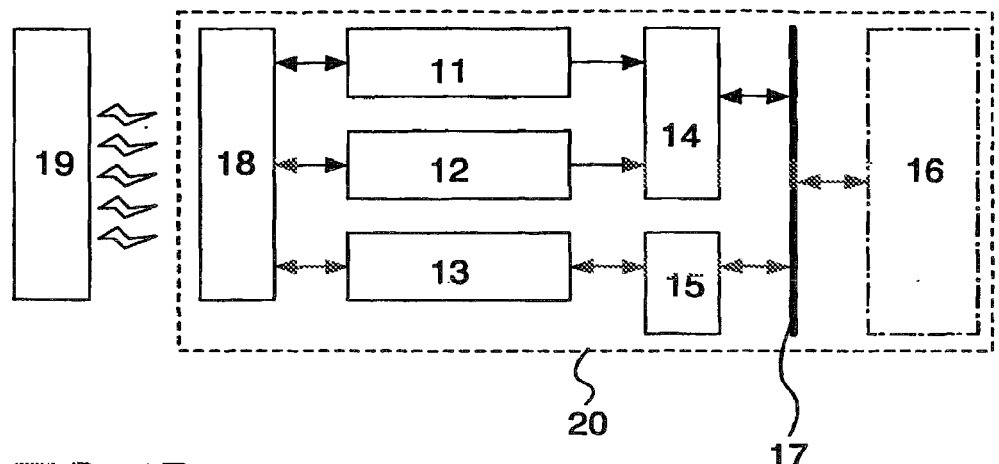
FIGS. 1A and 1B are diagrams illustrating a semiconductor device according to the present invention and a method for driving the semiconductor device.

Embodiment modes of the present invention will be described below with reference to the accompanying drawings. However, the present invention is not limited to the following descriptions, and it is to be easily understood that various changes and modifications will be apparent to those skilled in the art unless such changes and modifications depart from the scope of the present invention. Therefore, the present invention is not to be construed with limitation to what is described in the embodiment modes. It is to be noted that the reference numeral that denotes the same object is used in common between different drawings in the following embodiment modes of the present invention.

Embodiment Mode 1

A semiconductor device 20 described in the present embodiment mode has a function of non-contact exchange of data, and includes a power supply circuit 11, a clock generation circuit 12, a data demodulation/modulation circuit 13, a control circuit 14 that controls other circuits, an interface circuit 15, a memory 16, a data bus 17, and an antenna 18 (an antenna coil) (FIG. 1A). The power supply circuit 11 is a circuit that generates various power sources to be supplied to each circuit in the semiconductor device 20, based on input an alternating-current signal from the antenna 18. The clock generation circuit 12 is a circuit that generates various clock signals to be supplied to each circuit in the semiconductor device 20, based on input an alternating-current signal from the antenna 18. The data demodulation/modulation circuit 13 has a function of demodulating/modulating data for exchange with a reader/writer 19. The control circuit 14 has a function of controlling the memory 16. The antenna 18 has a function of sending and receiving electromagnetic fields or radio waves. The reader/writer 19 controls communication with the semiconductor device 20 and processing of the data. It is to be noted that the semiconductor device 20 is not limited to the described above, and for example, another element such as a power supply voltage limiter circuit or hardware for processing codes only may be added to the structure described above.

Further, in FIG. 1A, the memory 16 has a feature of having a structure (hereinafter, also referred to as "an organic memory element") in which a layer including an organic compound (hereinafter, also referred to as "an organic compound layer") is provided between a pair of conductive layers. The memory 16 may include not only a memory composed of an organic memory element but also other memories. The other memories include, for example, one or more memories selected from the group consisting of a DRAM, an SRAM, a FeRAM, a mask ROM, a PROM, an EPROM, an EEPROM, and a flash memory.

The memory including the organic memory element (hereinafter, also referred to as "an organic memory") uses an organic compound material, and the electrical resistance of the organic memory element is changed by applying optical or electric action to the organic compound layer.

Figure 1B:
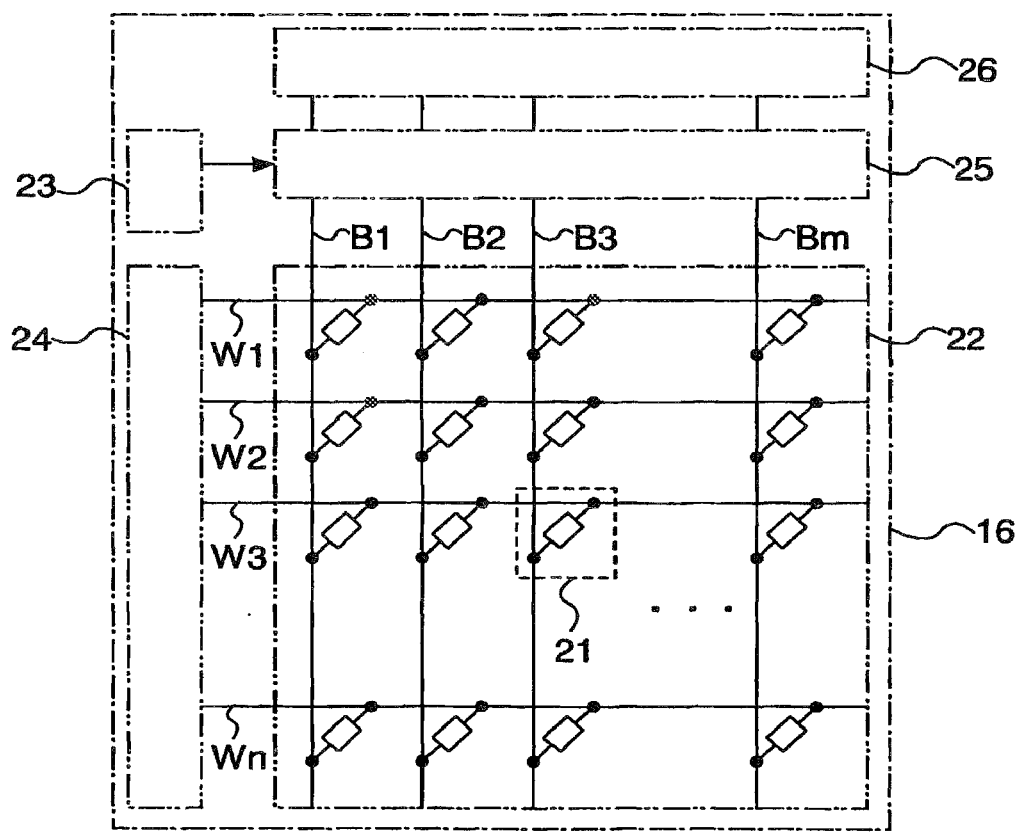

Next, the structure of an organic memory will be described (FIG. 1B). The organic memory includes a memory cell array 22 in which a memory cell 21 including an organic memory element is provided in a matrix, decoders 23 and 24, a selector 25, and a read/write circuit 26.

The memory cell 21 includes a first conductive layer connected to a bit line Bx ($1 \leq x \leq m$), a second conductive layer connected to a word line Wy ($1 \leq y \leq n$), and an organic compound layer. The organic compound layer is provided between the first conductive layer and the second conductive layer.

Next, for the case of manufacturing the memory cell array 22 actually, the top-view structure and cross-sectional structure thereof will be described (FIGS. 2A and 2B). It is to be noted that the memory cell array 22 on a substrate 30 with an insulating surface includes first conductive layers 27 extending in a first direction, second conductive layers 28 extending in a second direction perpendicular to the first direction, and organic compound layers 29. The memory cell 21 is provided at an intersection portion of the first conductive layer 27 and the second conductive layer 28. The first conductive layers 27 and the second conductive layers 28 are provided like stripes to intersect with each other. An insulating layer 33 is provided between the adjacent organic compound layers 29. In addition, an insulating layer 34 that serves as a protective film is provided to have contact with the second conductive layers 28.

As the substrate 30, a glass substrate, a flexible substrate, a quartz substrate, a silicon substrate, a metal substrate, a stainless-steel substrate, or the like is used. A flexible substrate refers to a substrate that is flexible and can be bent, and includes, for example, a plastic substrate including polycarbonate, polyalylate, polyethersulfone, or the like. The first conductive layers 27 and the second conductive layers 28 are formed with the use of a known conductive material such as aluminum (Al), copper (Cu), and silver (Ag).

In the case of writing data an organic memory by light, one or both of the first conductive layers 27 and the second conductive layers 28 have a light-transmitting property. A light-transmitting conductive layer is formed with the use of a transparent conductive material such as indium tin oxide (ITO), or formed with the use of a conductive material that is not transparent to have a thickness that is able to transmit light.

For the organic compound layers 29, conductive (preferably, the electric conductivity is $10^{-15}$ S/cm or more and $10^{-3}$ S/cm or less) organic compound materials can be used, and highly hole transporting materials, for example, aromatic amine (that is, having a benzene ring-nitrogen bond) compounds such as 4,4'-bis[N-(1-naphthyl)-N-phenylamino]-biphenyl (abbreviation: α-NPD), 4,4'-bis[N-(3-methylphenyl)-N-phenylamino]-biphenyl (abbreviation: TPD), 4,4',4"-tris(N,N-diphenylamino)-triphenylamine (abbreviation: TDATA), 4,4',4"-tris[N-(3-methylphenyl)-N-phenylamino]-triphenylamine (abbreviation: MTDATA), and 4,4'-bis(N-(4-(N,N-di-m-tolylamino)phenyl)-N-phenylamino)biphenyl (abbreviation: DNTPD), phthalocyanine compounds such as phthalocyanine (abbreviation: $H_2Pc$), copper phthalocyanine (abbreviation: CuPc), and vanadyl phthalocyanine (abbreviation: VOPc), and the like can be used.

In addition, highly electron transporting materials can be used as the organic compound materials, for example, materials including a metal complex having a quinoline skeleton or a benzoquinoline skeleton, such as tris (8 quinolinolato) aluminum (abbreviation: $Alq_3$), tris(4-methyl-8-quinolinolato) aluminum (abbreviation: $Almq_3$), bis(10-hydroxybenzo [h]quinolinato) beryllium (abbreviation: $BeBq_2$), bis(2-methyl-8-quinolinolato)-4-phenylphenolato-aluminum (abbreviation: BAlq), and materials such as metal complexes having having an oxazole ligand or a thiazole ligand, such as bis[2-(2-hydroxyphenyl) benzoxazolato]zinc (abbreviation: $Zn(BOX)_2$) or bis[2-(2-hydroxyphenyl) benzothiazolato] zinc (abbreviation: $Zn(BTZ)_2$), can also be used. Further, in addition to metal complexes, compounds such as 2-(4-biphenylyl)-5-(4-tert butylphenyl)-1,3,4-oxadiazole (abbreviation: PBD), 1,3-bis[5-(p-tert-butylphenyl)-1,3,4-oxadiazole-2-yl] benzene (abbreviation: OXD-7), 3-(4 tert-butylphenyl)-4-phenyl-5-(4-biphenylyl)-1,2,4-triazole (abbreviation: TAZ), 3-(4 tert butylphenyl)-4-(4-ethylphenyl)-5-(4-biphenylyl)-1,2,4-triazole (abbreviation: p-EtTAZ), and bathophenanthroline (abbreviation: BPhen) can be used.

Further, the organic compound materials include 4-dicyanomethylene-2-methyl-6[2(1,1,7,7-tetramethyljulolidine-9 yl)ethenyl]-4H-pyran (abbreviation: DCJT), 4-dicyanomethylene-2-t-butyl-6-[2(1,1,7,7-tetramethyljulolidine-9-yl) ethenyl-4H-pyran (abbreviation: DCJTB), periflanthene, 2,5-dicyano-1,4 bis[2-(10-methoxy 1,1,7,7-tetramethyljulolidine-9-yl) ethenyl]benzene, N,N'-dimethylquinacridone (abbreviation: DMQd), coumarin 6, coumarin 545T,9,9'-bianthryl, 9,10-diphenylanthracene (abbreviation: DPA), 9,10-bis(2-naphthyl) anthracene (abbreviation: DNA), and 2,5,8,11-tetra-t-butylperylene (abbreviation: TBP). In addition, as a material that serves as a matrix when a layer in which the luminescent material mentioned above is dispersed is formed, anthracene derivatives such as 9,10-di (2-naphthyl)-2-tert butylanthracene (abbreviation: t-BuDNA), carbazole derivatives such as 4,4'-bis(N-carbazolyl) biphenyl (abbreviation: CBP), metal complexes such as bis[2-(2-hydroxyphenyl) pyridinato]zinc (abbreviation: $Znpp_2$) and bis[2-(2-hydroxyphenyl) benzoxazolato]zinc (abbreviation: ZnBOX, and the like can be used, and further, tris(8-quinolinolato) aluminum (abbreviation: $Alq_3$), 9,10-bis(2-naphthyl) anthracene (abbreviation: DNA), bis(2-methyl-8-quinolinolato)-4-phenylphenolato-aluminum (abbreviation: BAlq), and the like can be used.

Furthermore, as a material for the organic compound layers 29, a material can be used so that the electrical resistance of an organic memory element is changed by applying optical or electric action. For example, a conjugated polymer doped with a compound (photoacid generator) that generates acid by absorbing light can be used, where polyacetylene group, polyphenylenevinylene group, polythiophene group, polyaniline group, polyphenyleneethylene group, and the like can be used as the conjugated polymer. In addition, as the photoacid generator, arylsulfonium salt, aryliodonium salt, o-nitrobenzyltosylate, arylsulfonic acid p-nitrobenzylether, sulfonylacetophenone group, Fe-arene complexes $PF_6$ salt, and the like can be used.

In addition, a rectifying element may be provided between the first conductive layer 27 and the organic compound layer 29 or between the second conductive layer 28 and the organic compound layer 29 (refer to FIG. 2D). A rectifying element typically indicates a schottky diode, a PN junction diode, a PIN junction diode, or a transistor that has a gate electrode and a drain electrode connected to each other. Of course, a diode that has another structure may be provided. FIG. 2D shows a case in which a PN junction diode including semiconductor layers 44 and 45 is provided between the first conductive layer 27 and the organic compound layer 29. One of the semiconductor layers 44 and 45 is an N-type semiconductor, and the other is a P-type semiconductor. As described above, the selectivity of a memory cell and the operation properties of reading and writing can be improved by providing a rectifying element.

Figure 15:
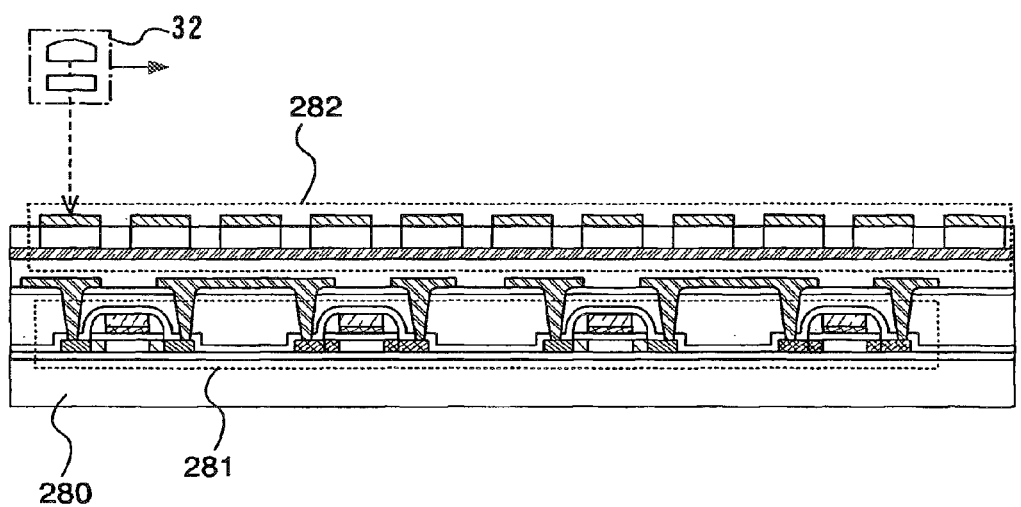
FIG. 15 is a diagram illustrating a semiconductor device according to the present invention.

In addition, as shown in FIG. 15, a memory 282 including an organic compound layer provided between a pair of conductive layers can be provided over an integrated circuit 281. Namely, the integrated circuit 281 may be provided over a substrate 280, and the memory 282 may be formed thereover.

As described above, the organic memory element described in the present embodiment mode has a simple structure in which an organic compound layer is provided between a pair of electrodes. Therefore, the manufacturing process thereof is simple, and providing inexpensive semiconductor devices is thus made possible. In addition, the organic memory described in the present embodiment mode is a nonvolatile memory. Therefore, it is not necessary to incorporate a battery for holding data, and thus, small, thin, and lightweight semiconductor devices can be provided. Further, since the electric resistance of the organic memory element is irreversibly changed by writing, rewriting of data is not possible while writing of data (write once read many) is possible. Accordingly, it is possible to provide a semiconductor device for which falsification is prevented and security is ensured.

Next, operation in writing of data into the organic memory will be described. Writing of data is carried out by optical action or electric action. First, a case of carrying out writing of data by electric action will be described (refer to FIG. 1B). It is to be noted that the writing is carried out by changing an electronic property of the memory cell, where the initial state (a state without electric action applied) of the memory cell is data "0", and a state with the electronic property changed is data "1".

In the case of writing data "1" in the memory cell 21, the memory cell 21 is first selected by the decoders 23 and 24 and the selector 25. Specifically, a predetermined voltage V2 is applied to the word line W3 connected to the memory cell 21 by the decoder 24. Further, the bit line B3 connected to the memory cell 21 is connected to the read/write circuit 26 by the decoder 23 and the selector 25. Then, a write voltage V1 is output from the read/write circuit 26 to the bit line B3. In this way, the voltage Vw=V1−V2 is applied between the first and the second conductive layers included in the memory cell 21. By selecting the potential Vw appropriately, the organic compound layer 29 provided between the conductive layers is physically or electrically changed to carry out writing of the data "1". Specifically, at an operating voltage for reading, the electrical resistance between the first and second conductive layers in the state of the data "1" is preferably changed so that the electrical resistance is much smaller as compared with in the state of the data "0". For example, V1 and V2 may be selected from the range of (V1, V2)=(0 V, 5 to 15 V) or (3 to 5 V, −12 to −2 V). The voltage Vw may be 5 to 15 V, or −5 to −15 V. It is to be noted that the distance between the pair of electrodes provided to sandwich the organic compound layer can be changed in this case.

It is to be noted that a non-selected word line and a non-selected bit line are controlled so that data "1" is not written in the memory cell connected to the non-selected word line and the non-selected bit line. For example, the non-selected word line and the non-selected bit line may be made floating. It is necessary to have a characteristic that is capable of ensuring selectivity, such as a diode characteristic, between first and second conductive layers constituting a memory cell.

On the other hand, in the case of writing data "0" in the memory cell 21, all that is required is that electric action is not applied to the memory cell 21. In circuit operation, for example, in the same way as in the case of writing data "1", the memory cell 21 is selected by the decoders 23 and 24 and the selector 25. However, the output potential from the read/write circuit 26 to the bit line B3 is made nearly equal to the potential of the selected word line W3 or the potential of a non-selected word line so that a voltage (for example, −5 to 5 V) is applied between the first and second conductive layers constituting the memory cell 21 to such a degree that the electronic property of the memory cell 21 is not changed.

Next, a case of carrying out writing of data by optical action will be described. In the case of carrying out writing of data by optical action, the organic compound layer 29 is irradiated with laser light from the light-transmitting conductive layer side (the second conductive layer 28 here). Here, the organic compound layer 29 included in an organic memory element in a desired portion is selectively irradiated with laser light to destroy the organic compound layer 29. Since the destroyed organic compound layer is insulated, the electric resistance of the destroyed organic compound layer is larger when the organic memory element including the broken organic compound layer is compared with another organic memory element. In this way, the change in the electric resistance between the conductive layers provided with organic compound layer 29 sandwiched therebetween, by laser irradiation, is used to carry out writing of data. For example, in the case where an organic memory element including an organic compound layer that is not irradiated with laser light is made to have data "0", when data "1" is written, an organic compound layer included in an organic memory element in a desired portion is selectively irradiated with laser light and thus destroyed to increase the electric resistance.

In addition, in the case of using a conjugated polymer doped with a compound (photoacid generator) that generates acid by absorbing light, when laser irradiation is performed, only an organic memory element including an organic compound layer irradiated with laser light has an electric conductivity increased. On the other hand, an organic memory element including an organic compound layer that is not irradiated with laser light has no electric conductivity. Therefore, an organic compound layer included in an organic memory element in a desired portion is selectively irradiated with laser light to change the electric resistance of the organic memory element including the organic compound layer irradiated with laser light, which is used to carry out writing of data. For example, in the case where an organic memory element including an organic compound layer that is not irradiated with laser light is made to have data "0", when data "1" is written, an organic compound layer included in an organic memory element in a desired portion is selectively irradiated with laser light to increase the electric conductivity.

In the case of laser light irradiation, the change in the electric resistance of an organic memory element depends on the size of the memory cell 21. However, the change is achieved by irradiation with laser light focused in a range from a few μm to a few hundred μm in diameter. For example, when a laser beam 1 μm in diameter passes at a linear velocity of 10 m/sec, the time for which an organic memory element included in one memory cell 21 is irradiated with laser light is 100 nsec. In order to change the phase within the short time of 100 nsec, the laser power and the power density is preferably 10 mW and 10 kW/mm$^2$, respectively. In addition, it is preferable to use a pulsed-oscillation laser irradiation system when laser light irradiation is selectively performed.

Figure 12:
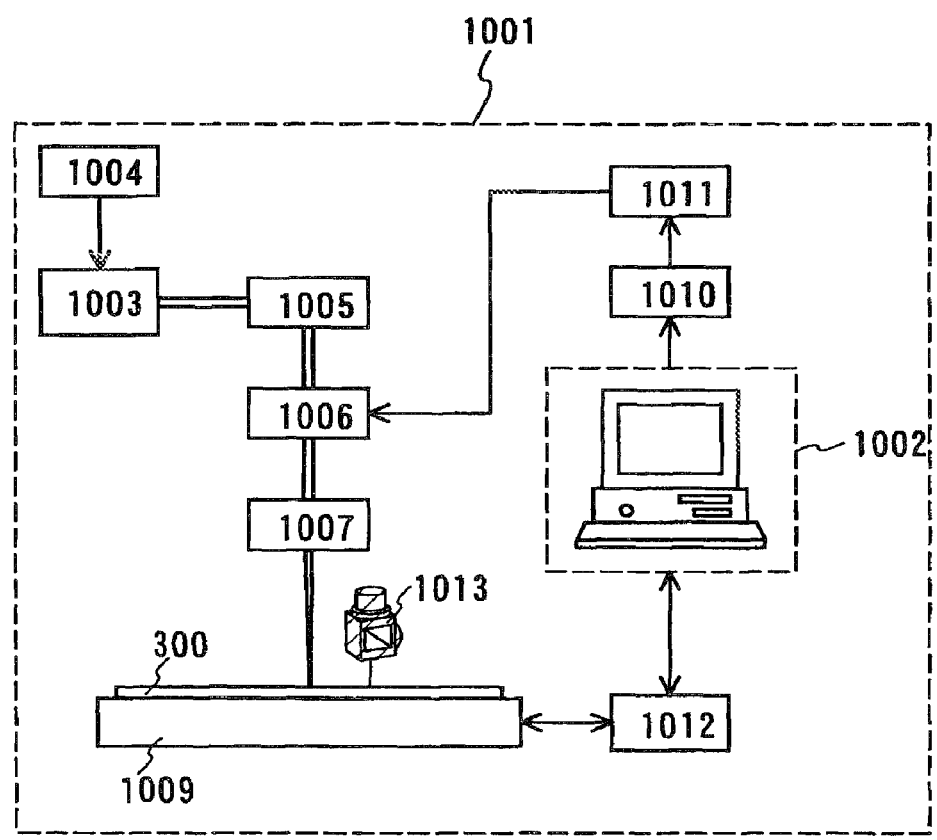
FIG. 12 is diagram illustrating an example of a laser irradiation system according to the present invention according to the present invention.

Now, an example of laser irradiation systems will be briefly described with reference to FIG. 12. A laser irradiation system 1001 has a computer 1002 that executes various controls (hereinafter, referred to as a PC 1002), a laser oscillator 1003 that outputs laser light, a power supply 1004 for the laser oscillator, an optical system 1005 (an ND filter) for attenuating laser light, an acousto-optic modulator 1006 (AOM) for modulating the intensity of laser light, an optical system 1007 for reducing a cross section of laser light, which includes a lens and a mirror for changing a light path, a moving mechanism 1009 including an X-axis stage and a Y-axis stage, a D/A converter 1010 that performs digital-analog conversion of control data output from the PC 1002, a driver 1011 that controls the acousto-optic modulator 1006 in accordance with an analog voltage output from the D/A converter 1010, a driver 1012 that outputs a driving signal for driving the moving mechanism 1009, and an autofocus mechanism 1013 for focusing laser light on an object to be irradiated (FIG. 12).

As the laser oscillator 1003, a laser oscillator that is capable of emitting ultraviolet, visible light, or an infrared light can be used. As the laser oscillator, an excimer laser oscillator using KrF, ArF, XeCl, Xe, or the like, a gas laser oscillator using He, He—Cd, Ar, He—Ne, HF, or the like, a solid laser oscillator using a crystal (YAG GdVO$_4$, YVO$_4$, YLF, YAlO$_3$, or the like) doped with Cr, Nd, Er, Ho, Ce, Co, Ti, or Tm, and a semiconductor laser oscillator using GaN, GaAs, GaAlAs, InGaAsP, or the like can be used. It is to be noted that it is preferable to apply one of a fundamental wave and the second to fifth harmonics in the case of the solid laser oscillator.

Next, an irradiation method using the laser irradiation system will be described. When the substrate 30 provided with the organic compound layer 29 is loaded on the moving mechanism 1009, the PC 1002 detects the position of the organic compound layer 29 to be irradiated with laser light by a CCD camera or the like. Then, based on the detected position data, the PC 1002 generates moving data for moving the moving mechanism 1009.

After this, while the PC 1002 controls the output light intensity of the acousto-optic modulator 1006 through the driver 1011, laser light output from the laser oscillator 1003 is attenuated by the optical system 1005, and then, the light intensity is controlled by the acousto-optic modulator 1006 so as to be predetermined light intensity. Further, the light path and the beam-spot shape of the laser light output from the acousto-optic modulator 1006 are changed by the optical system 1007, the laser light is condensed with a lens, and then, the organic compound layer 29 over the substrate 30 is irradiated with the laser light selectively.

At this point, in accordance with the moving data generated by the PC 1002, the moving mechanism 1009 is moved in the X direction and the Y direction. Accordingly, the predetermined position is irradiated with the laser light, the light energy density of the laser light is converted into thermal energy, and thus, the organic compound layer 29 provided over the substrate 30 can be selectively irradiated With the laser light. It is to be noted that the laser light may be moved in the X direction and the Y direction by adjusting the optical system 1007 although a case of performing laser light irradiation by moving the moving mechanism 1009 is shown here.

As described above, the aspect according to the present invention, in which writing of data is preformed by laser light irradiation, makes it possible to manufacture a large amount of semiconductor devices easily. Therefore, inexpensive semiconductor devices can be provided.

Figure 9A:
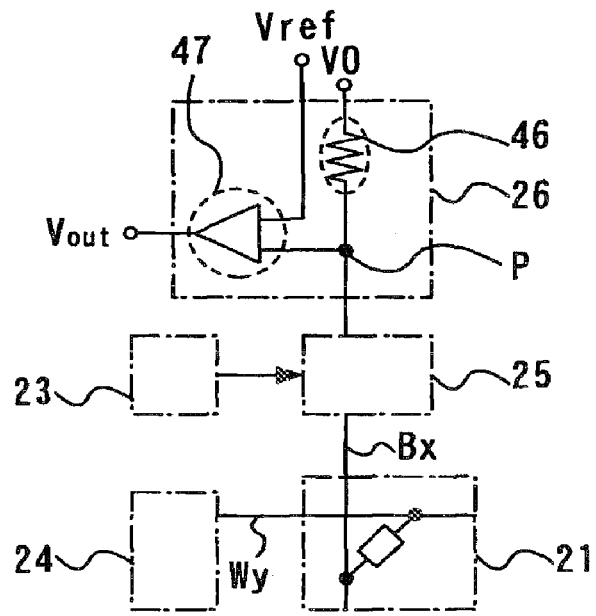
FIGS. 9A and 9B are diagrams illustrating a semiconductor device according to the present invention and a method for driving the semiconductor device.
Figure 9B:
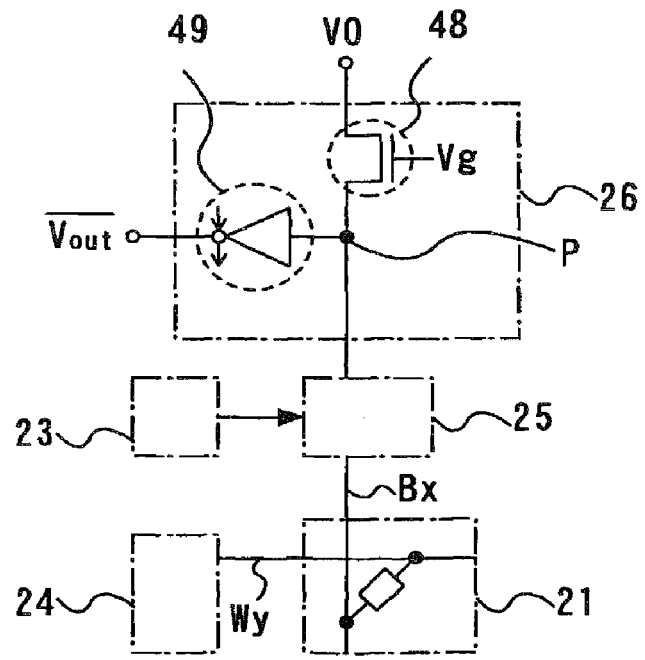

Next, operation in reading of data from an organic memory will be described (refer to FIG. 1B and FIGS. 9A and 9B). Reading of data is carried out by using an electronic property between first conductive layers constituting a memory cell, which is different between a memory cell with data "0" and a memory cell with data "1". For example, a method for reading by using difference in electric resistance will be described, where the effective electric resistance between first and second conductive layers constituting a memory cell with data "0" (hereinafter, simply referred to as the electric resistance of a memory cell) is R0 at a reading voltage, and the electric resistance of a memory cell with data "1" is R1(R1<<R0) at a reading voltage. As for as read/write circuit, for example, a circuit 26 using a resistive element 46 and a differential amplifier 47, which is shown in FIG. 9A, can be considered as a structure of a reading portion. The resistive resistance 46 has a resistance value Rr (R1<Rr<R0). A transistor 48 may be used instead of the resistive element 46, and a clocked inverter 49 can be used instead of the differential amplifier 47 (FIG. 9B). A signal or an inverted signal that is Hi when reading is carried out and is Lo when reading is not carried out is input to the clocked inverter 49. Of course, the circuit configuration is not limited to FIGS. 9A and 9B.

When reading of data from the memory cell 21 is carried out, first, the memory cell 21 is selected by the decoders 23 and 24 and the selector 25. Specifically, by the decoder 24, a predetermined voltage Vy is applied to the word line Wy connected to the memory cell 21. Further, by the decoder 23 and the selector 25, the bit line Bx connected to the memory cell 21 is connected to a terminal P of the read/write circuit 26. Accordingly, the potential Vp of the terminal P is a value determined by resistance dividing Vy and V0 by the resistive element 46 (resistance value: Rr) and the memory cell 21 (resistance value: R0 or R1). Therefore, when the memory cell 21 has data "0", Vp0=Vy+(V0−Vy)*R0/(R0+Rr). Also, when the memory cell 21 has data "1", Vp1=Vy+(V0−Vy)*R1/(R1+Rr). Accordingly, by selecting Vref so as to be between Vp0 and Vp1 in FIG. 9A or selecting the point of variation of the clocked inverter 49 so as to be between Vp0 and Vp1 in FIG. 9B, an output potential Vout of Lo/Hi (or Hi/Lo) is output in accordance with data "0"/"1" so that reading can be carried out.

For example, assume that the differential amplifier 47 is made to operate at Vdd=3 V, and Vy, V0, and Vref are 0 V, 3 V, and 1.5 V, respectively. On the condition of R0/Rr=Rr/R1=9, Hi is output as Vout in accordance with Vp0=2.7 V when a memory cell has data "0", or Lo is output as Vout in accordance with Vp1=0.3 V when a memory cell has data "1". In this way, reading from a memory cell can be carried out.

According to the method described above, the state of the electric resistance of an organic memory element is read in voltage by using difference in resistance value and resistance division. Of course, the method for reading is not limited to this method. For example, reading may be carried out by using difference in current value other than using difference in electric resistance. In addition, when an electronic property a memory cell has different diode characteristics in threshold voltage in the case of data "0" and data "1", reading may be carried out by using difference in threshold voltage.

Embodiment Mode 2

As described above, a semiconductor device has a memory. A semiconductor device that is different from the semiconductor device in the embodiment mode described above will be described below with reference to the accompanying drawings.

Figure 10A:
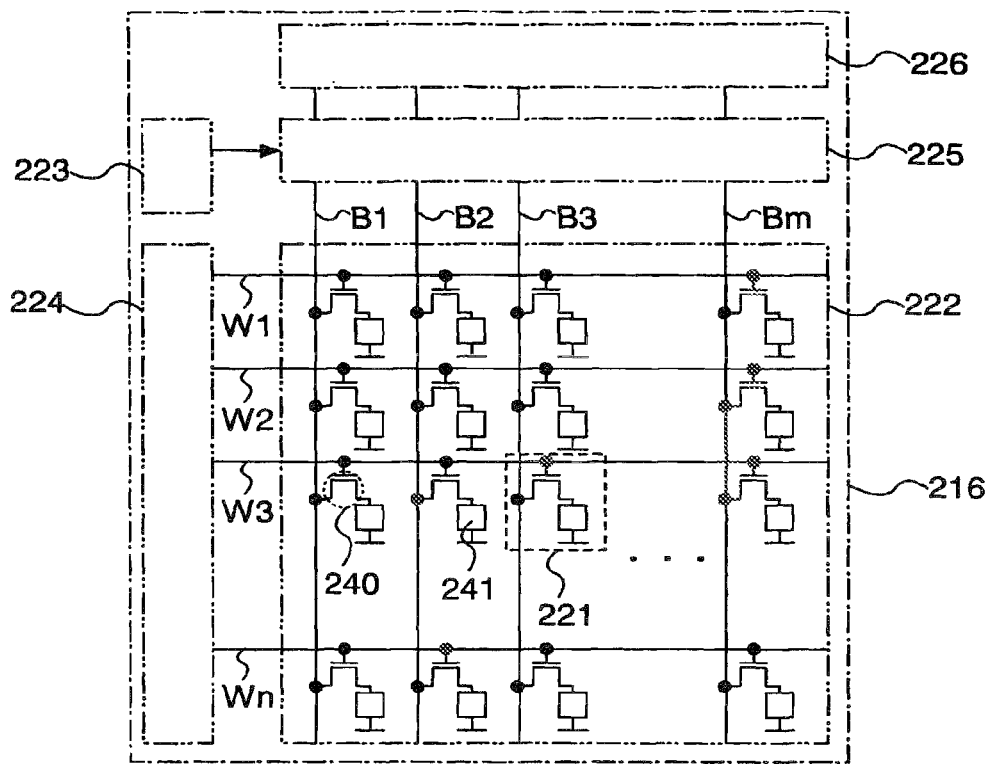
FIGS. 10A to 10C are diagrams illustrating a semiconductor device according to the present invention and a method for driving the semiconductor device.

A memory 216 has a memory cell array 222 in which a memory cell 221 is provided in a matrix, decoders 223 and 224, a selector 225, and a read/write circuit 226 (FIG. 10). It is to be noted the structure of the memory 216 shown here is just an example, another circuit such as a sense amplifier, an output circuit, or a buffer may be included.

The memory cell 221 a first conductive layer connected to a bit line Bx ($1 \leq x \leq m$), a second conductive layer connected to a word line Wy ($1 \leq y \leq n$), a transistor 240, and a memory element 241 (hereinafter, also referred to as an organic memory element 241). The memory element 241 has a structure in which an organic compound layer is sandwiched between a pair of electrodes. The transistor 240 has a gate electrode connected to the word line Wy. One of a source electrode and a drain electrode of the transistor 240 is connected to the bit line Bx while the other is connected to one of two terminals of the memory element 241. The other terminal of the memory element 241 is connected to a common electrode (potential: Vcom).

Figure 11:
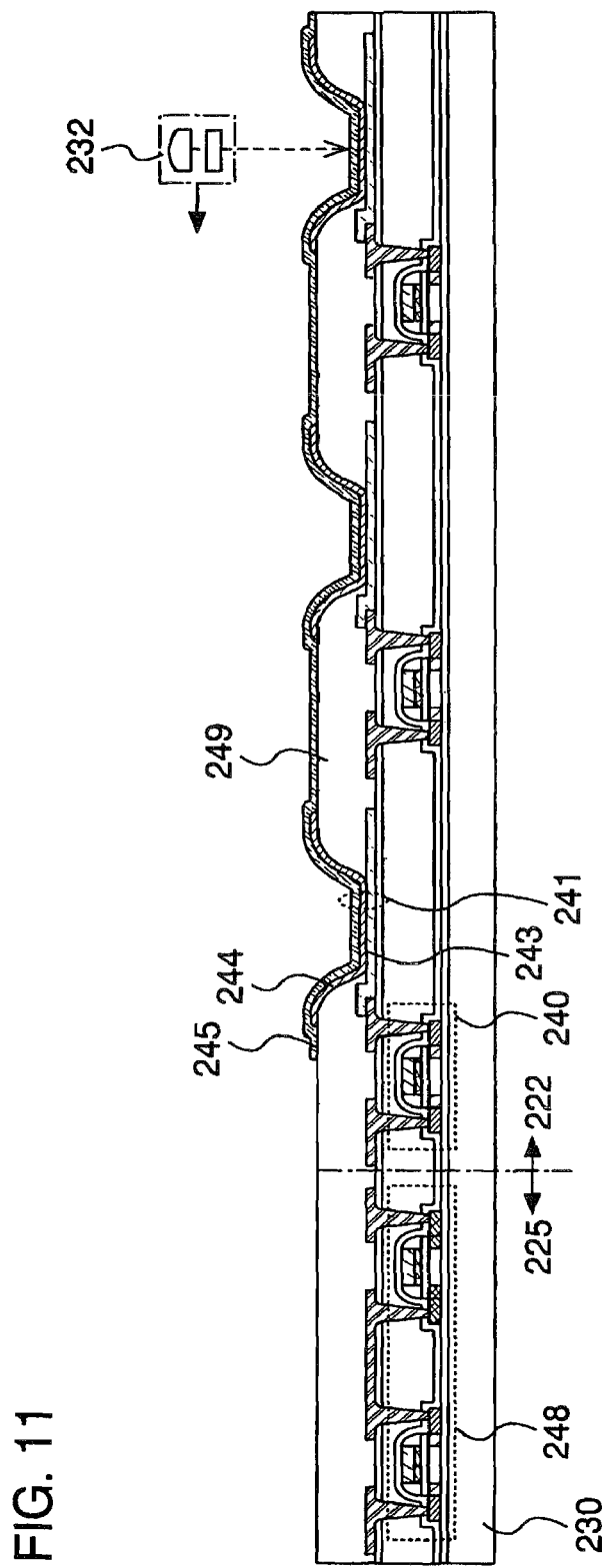
FIG. 11 is a diagram illustrating a semiconductor device according to the present invention and a method for driving the semiconductor device.

Next, a cross-sectional structure of the memory 216 that has the structure described above will be described (refer to FIG. 11).

Cross-sectional structures of the transistor 240, the organic memory element 241, and a CMOS circuit 248 included in the selector 225 are shown here. The transistor 240 and the CMOS circuit 248 are provided over a substrate 230, and the organic memory element 241 is formed to be electrically connected the transistor 240.

The organic memory element 241 is formed to have a laminated body of a first conductive layer 243, an organic compound layer 244, and a second conductive layer 245, and an insulating layer 249 is provided the adjacent organic memory elements 241. The insulating layer 249 is formed as a partition for separating the plurality of organic memory elements 241. In addition, a source or drain region of the transistor 240 and the first conductive layer 243 included in the organic memory element 241 are electrically connected to each other.

In addition, each of the first conductive layer 243 and the second conductive layer 245 is formed with the used of a conductive material such as aluminum (Al), copper (Cu), silver (Ag), or titanium (Ti).

When writing of data is carried out by optical action, one or both of the first and second conductive layers 243 and 245 are formed with the used of a light-transmitting material such as indium tin oxide (ITO) or formed to have a thickness through which light is transmitted. When writing of data is carried out by electric action, materials to be used for the first conductive layer 243 and the second conductive layer 245 are not particularly restricted.

The organic compound layer 244 is formed as described in Embodiment Mode 1, for which a single layer or a laminated structure including any of the materials mentioned above can be used.

When an organic compound material is used for the organic compound layer 244, writing of data is carried out by applying optical action such as laser light or electric action. In addition, when a conjugated polymer doped with a photoacid generator is used, writing of data is carried out by optical action. Reading of data does not depend on the material of the organic compound layer 244, and is carried out by electric action in any case.

Next, operation in writing of data into the memory 216 will be described (FIGS. 10A to 10C and FIG. 11).

First, operation in writing of data by electric action will be described (refer to FIG. 1B). It is to be noted that the writing is carried out by changing an electronic property of the memory cell, where the initial state (a state without electric action applied) of the memory cell is data "0", and a state with the electronic property changed is data "1".

A case of writing data into the memory cell 221 at the n-th row and the m-th column will be described here. In the case of writing data "1" in the memory cell 221, the memory cell 221 is first selected by the decoders 223 and 224 and the selector 225. Specifically, a predetermined voltage V22 is applied to the word line Wn connected to the memory cell 221 by the decoder 224. Further, the bit line Bm connected to the memory cell 221 is connected to the read/write circuit 226 by the decoder 223 and the selector 225. Then, a write voltage V21 is output from the read/write circuit 226 to the bit line Bm.

In this way, the transistor 240 constituting the memory cell 221 is made in an ON state, and the common electrode and the bit line Bm are thus electrically connected to the memory element 241 so that a voltage of approximately Vw=Vcom−V21 is applied to the memory element 241. By selecting the potential Vw appropriately, the organic compound layer 244 provided between the conductive layers is physically or electrically changed to carry out writing of the data "1". Specifically, at an operating voltage for reading, the electrical resistance between the first and second conductive layers in the state of the data "1" is preferably changed so that the electrical resistance is much smaller as compared with in the state of the data "0", and the memory element 241 may be simply short circuited. It is to be noted that the potentials V21, V22, and Vcom may be selected from the range of (V21, V22, Vcom)= (5 to 15 V, 5 to 15 V, 0) or (−12 to 0 V, −12 to 0 V, 3 to 5 V). The voltage Vw may be 5 to 15 V, or −5 to −15 V. It is to be noted that the distance between the pair of electrodes provided to sandwich the organic compound layer can be changed in this case.

It is to be noted that a non-selected word line and a non-selected bit line are controlled so that data "1" is not written in the memory cell connected to the non-selected word line and the non-selected bit line. Specifically, while a voltage (for example, 0 V) that puts a transistor in the connected memory cell connected into an OFF state is applied to the non-selected word line, the non-selected bit line may be made floating, or a potential that is nearly equal to Vcom may be applied to the non-selected bit line.

On the other hand, in the case of writing data "0" in the memory cell 221, all that is required is that electric action is not applied to the memory cell 221. In circuit operation, for example, in the same way as in the case of writing data "1", the memory cell 221 is selected by the decoders 223 and 224 and the selector 225. However, the output potential from the read/write circuit 226 to the bit line Bm is made nearly equal to Vcom, or the bit line Bm is made floating. Consequently, a small voltage (for example, −5 to 5 V) or no voltage is applied to the memory element 241, and thus, the electric property, is not changed so that writing of data "0" is achieved.

Next, a case of carrying out writing of data by optical action will be described. In this case, the organic compound layer 244 included in the organic memory element 241 is irradiated with laser light from the light-transmitting conductive layer side (the second conductive layer 245 here).

When an organic compound material is used for the organic compound layer 244, the organic compound layer 244 is oxidized or carbonized by laser light irradiation to be insulated. Thus, the resistance value of the organic memory element 241 irradiated with laser light is increased while the resistance value of the organic memory element 241 that is not irradiated with laser light is not changed. In addition, when a conjugated polymer doped with a photoacid generator is used, an electric conductivity is given to the organic compound layer 244 by laser light irradiation. Namely, an electric conductivity is given to the organic memory element 241 irradiated with laser light while no electric conductivity is given to the organic memory element 241 that is not irradiated with laser light.

Figure 10B:
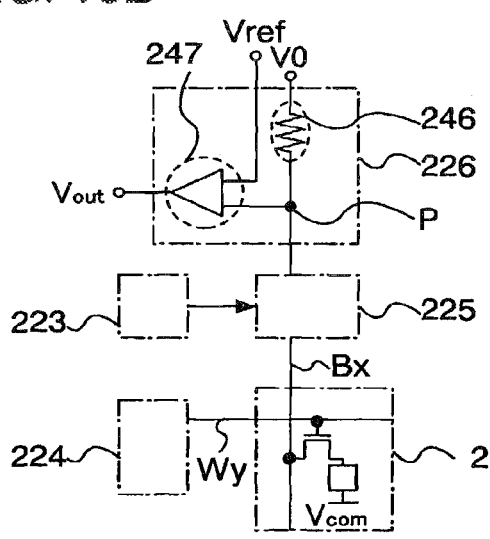
Figure 10C:
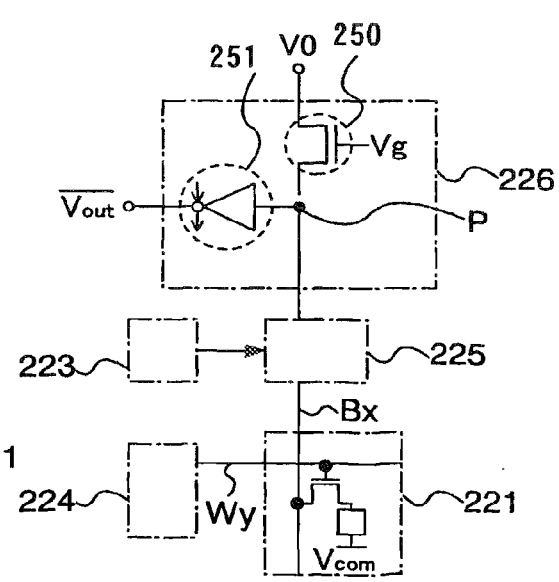

Next, operation in reading of data by electric action will be described. Reading of data is carried out by using an electronic property of the memory element 241, which is different between a memory cell with data "0" and a memory cell with data "1". For example, a method for reading by using difference in electric resistance will be described, where the electric resistance of a memory element constituting a memory cell with data "0" is R0 at a reading voltage, and the electric resistance of a memory cell constituting a memory cell with data "1" is R1(R1<<R0) at a reading voltage. As for as read/write circuit, for example, a circuit 226 using a resistive element 246 and a differential amplifier 247, which is shown in FIG. 10B, can be considered as a structure of a reading portion. The resistive element 246 has a resistance value Rr (R1<Rr<R0). A transistor 250 may be used instead of the resistive element 246, and a clocked inverter 251 can be used instead of the differential amplifier 247 (FIG. 10C). Of course, the circuit configuration is not limited to FIGS. 10B and 10C.

When reading of data from the memory cell 221 at the n-th row and the m-th column is carried out, first, the memory cell 221 is selected by the decoders 223 and 224 and the selector 225. Specifically, by the decoder 224, a predetermined voltage V24 is applied to the word line Wn connected to the memory cell 221 to put the transistor 240 into an ON state. Further, by the decoder 223 and the selector 225, the bit line Bx connected to the memory cell 221 is connected to a terminal P of the read/write circuit 226. Accordingly, the potential Vp of the terminal P is a value determined by resistance dividing Vcom and V0 by the resistive element 246 (resistance value: Rr) and the memory element 241 (resistance value: R0 or R1). Therefore, when the memory cell 221 has data "0", Vp0=Vcom+(V0−Vcom)*R0/(R0+Rr). Also, when the memory cell 221 has data "1", Vp1=Vcom+(V0−Vcom)*R1/(R1+Rr). Accordingly, by selecting Vref so as to be between Vp0 and Vp1 in FIG. 10B or selecting the point of variation of the clocked inverter 251 so as to be between vp0 and Vp1 in FIG. 10C, an output potential Vout of Lo/Hi (or Hi/Lo) is output in accordance with data "0"/"1" so that reading can be carried out.

For example, assume that the differential amplifier 47 is made to operate at Vdd=3 V, and Vcom, V0, and Vref are 0 V, 3 V, and 1.5 V, respectively. On the condition of R0/Rr=Rr/R1=9 and the condition that the ON resistance of the transistor 240 is negligible, Hi is output as Vout in accordance with Vp0=2.7 V when a memory cell has data "0", or Lo is output as Vout in accordance with Vp1=0.3 V when a memory cell has data "1". In this way, reading from a memory cell can be carried out.

According to the method described above, the state of the electric resistance of the memory element 241 is read in voltage by using difference in the resistance value of the memory element 241 and resistance division. Of course, the method for reading is not limited to this method. For example, reading may be carried out by using difference in current value other than using difference in electric resistance. In addition, when an electronic property of a memory cell has different diode characteristics in threshold voltage in the case of data "0" and data "1", reading may be carried out by using difference in threshold voltage.

It is to be noted that the present embodiment mode can be carried out freely in combination with the embodiment mode described above.

Embodiment Mode 3

Figure 3A:
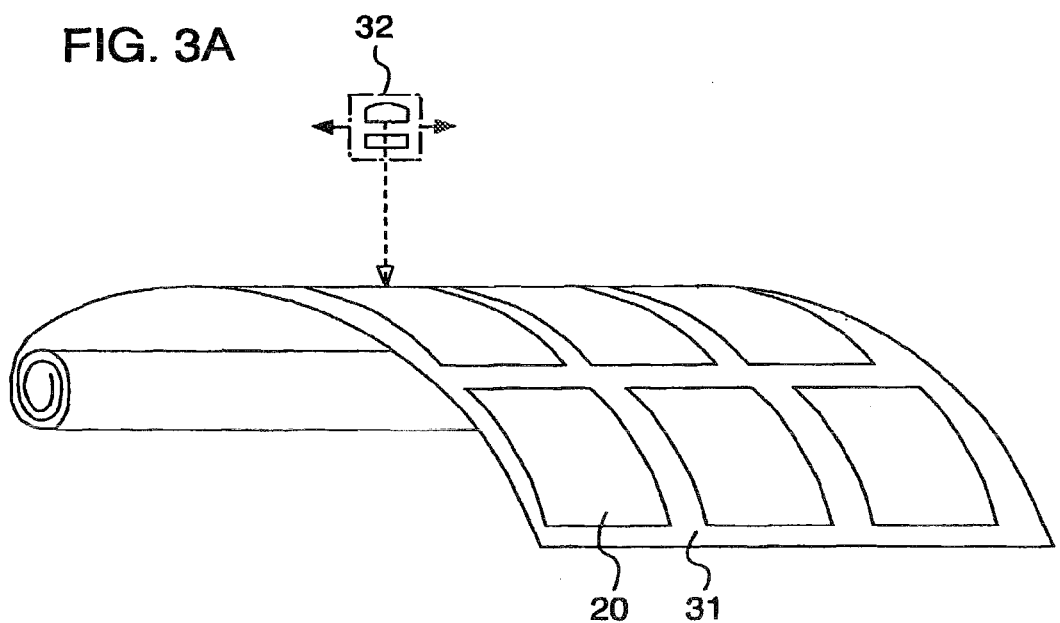
FIGS. 3A and 3B are diagrams illustrating a semiconductor device according to the present invention.

Writing of data in an organic memory included in a semiconductor device 20 according to the present invention is carried out by optical or electrical action. When writing of data is carried out by optical action, a plurality of semiconductor devices 20 are formed over a flexible substrate 31 and then irradiated with laser light by a laser light irradiating means 32 so that writing of data can be continuously carried out easily. Moreover, when this manufacturing process is employed, the semiconductor devfces 20 can be easily manufactured in large quantity (FIG. 3A). Accordingly, the inexpensive semiconductor devices 20 can be provided.

Figure 3B:
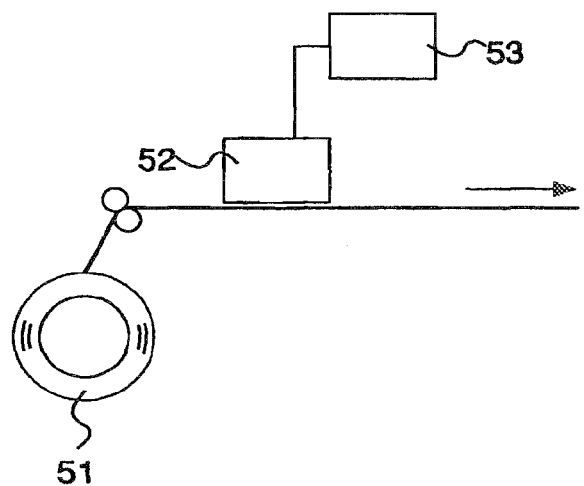

In addition, an organic compound layer included in an organic memory element can be intentionally dissolved or destroyed by heating to the melting point or more. Namely, writing of data can be carried out also by heat treatment as long as different heating temperatures are used. Accordingly, a manufacturing process using different heating temperatures may also be employed. For example, the flexible substrate 31 with a plurality of semiconductor devices formed is made to be a roll 51 (FIG. 3B). Then, writing of data may be carry out in such a way that different temperatures are used in heat treatment by a heating means 52. The heating means 52 is controlled by a control means 53.

It is to be noted that the present embodiment mode can be carried out freely in combination with the embodiment modes described above.

Embodiment Mode 4

Figure 4A:
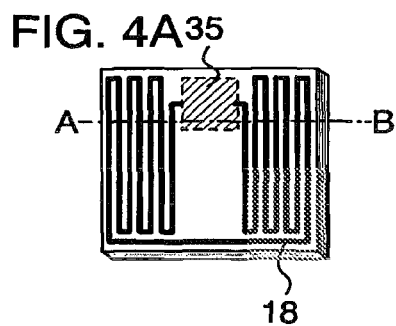
FIGS. 4A to 4D are diagrams illustrating examples of a process for manufacturing a semiconductor device according to the present invention.
Figure 4B:
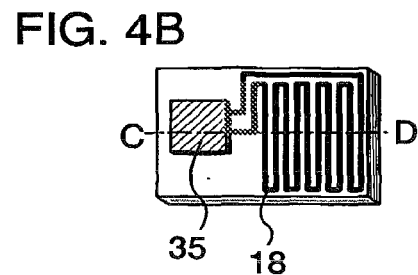
Figure 4C:
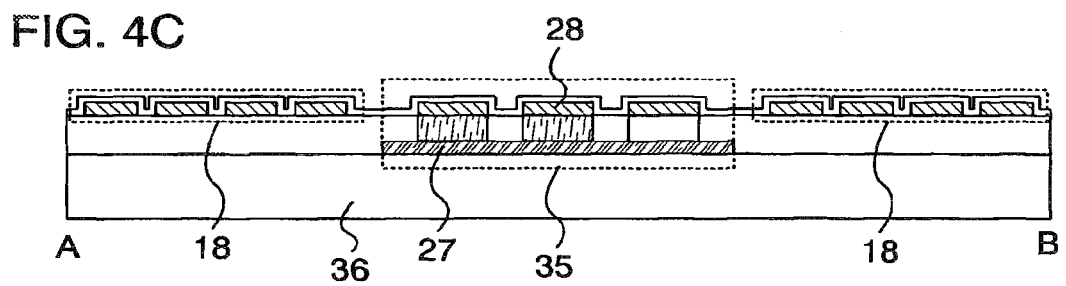
Figure 4D:
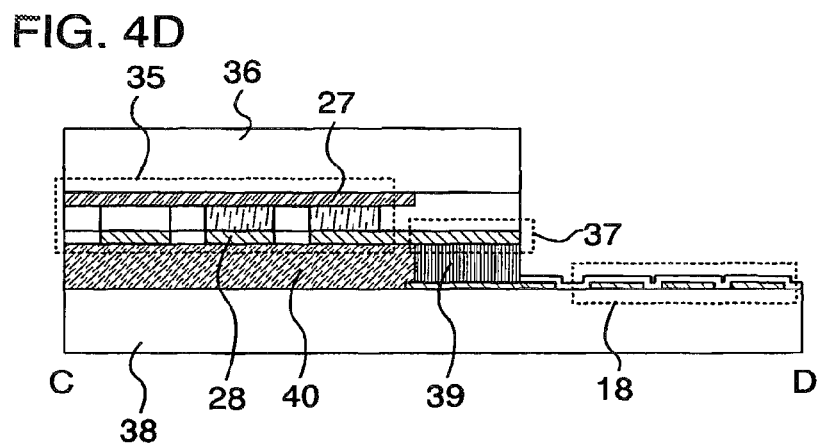

As an example of applications of a semiconductor device according to the present invention, there is a feature that non-contact writing and reading of data are possible since the organic memory element is provided. The data transmission methods are classified broadly into three of an electromagnetic coupling method of communicating by mutual induction with a pair of coils disposed in the opposed position, an electromagnetic induction method of communicating by an inductive electromagnetic field, and an electric wave method of communicating by using electric waves, and any of these methods may be employed. An antenna 18 that is used for transmitting data can be provided in two ways. One way is to provide the antenna 18 over a substrate 36 over which a plurality of elements including an organic memory element and the like are formed (FIGS. 4A and 4C), and the other way is to provide the antenna 18 so as to be connected to a terminal portion 37 that is provided on a substrate 36 over which a plurality of elements including an organic memory element are formed (FIGS. 4B and 4D). The plurality of elements provided over the substrate 36 is referred to as a group of elements 35 here.

In the case of the former structure (FIGS. 4A and 4C), the group of elements 35 and a conductive layer that functions as the antenna 18 are provided over the substrate 36. In the shown structure, the conductive layer that functions as the antenna 18 is provided in the same layer as the second conductive layer 28. However, the present invention is not restricted to the structure described above, and the antenna 18 may be provided in the same layer as the first conductive layer 27. Alternatively, an insulating film may be provided so as to cover the group of elements 35, and the antenna 18 may be provided over the insulating film.

In the latter structure (FIGS. 4B and 4D), the group of elements 35 and the terminal portion 37 are provided over the substrate 36. In the shown structure, a conductive layer provided in the same layer as the second conductive layer 28 is used as the terminal portion 37. Then, a substrate 38 over which the antenna 18 is provided is attached so as to be connected to the terminal portion 37. A conductive particle 39 and a resin 40 are provided between the substrate 36 and the substrate 38. Note that a conductive layer which functions as the antenna 18 is connected to a transistor constituting a wave-shaping circuit or a rectification circuit provided in the group of elements 35. After data is rectified in the wave-shaping circuit or the rectification circuit, data sent from the outside without contact is sent to the organic memory element and writing or reading data is carried out through a writing circuit or a reading circuit The group of elements 35 can be provided inexpensively by forming and then dividing a plurality of groups of elements over a large area substrate. The substrate to be used in this case can be a glass substrate, a flexible substrate, and the like.

A plurality of transistors and organic memory elements included in the group of elements 35, and the like may be provided over a plurality of layers, that is, may be formed by using a plurality of layers. When the group of elements 35 is formed over a plurality of layers, an interlayer insulating film is used. For the interlayer insulating film, a resin material such as an epoxy resin and an acryl resin, a resin material such as a light-transmitting polyimide resin, a compound material including a siloxane material such as a siloxane resin, a material containing a water-soluble homopolymer and a water-soluble copolymer, and an inorganic material are preferably used. The siloxane material corresponds to a material including a Si—O—Si bond. Siloxane has a frame structure formed by bonding between silicon (Si) and oxygen (O), where an organic group including at least hydrogen (for example, an alkyl group and aromatic hydrocarbon) as a substituent. However, a fluoro group may be used as a substituent, or an organic group including at least hydrogen and a fluoro group may be used as substituents.

For the interlayer insulating film, a material with low dielectric constant is preferably used for decreasing parasitic capacitance that is generated between the layers. When the parasitic capacitance is decreased, high-speed operation as well as low power consumption can be achieved.

The plurality of transistors included in the group of elements 35 may use any of an amorphous semiconductor, a microcrystalline semiconductor, a polycrystalline semiconductor, an organic semiconductor, and the like for active layers. However, it is preferable to use an active layer crystallized by using a metal element as a catalyst or an active layer crystallized by laser irradiation in order to obtain a transistor that has favorable characteristics. Further, it is preferable to use, as an active layer, a semiconductor layer formed by plasma CVD with the use of a $SiH_4/F_2$ gas or a $SiH_4/H_2$ gas (Ar gas) or a semiconductor layer obtained by irradiating semiconductor layer with laser.

The plurality of transistors included in the group pf elements 35 can use a crystalline semiconductor layer (a low temperature polysilicon layer) crystallized at a temperature of 200 to 600° C. (preferably 350 to 500° C.) or a crystalline semiconductor layer (a high temperature polysilicon layer) crystallized at a temperature of 600° C. or higher. When a high temperature polysilicon layer is formed over a substrate, a quartz substrate is preferably used since a glass substrate is weak to heat.

It is preferable that the active layers (in particular, channel regions) of the transistors included in the group of elements 35 be doped with a hydrogen or halogen element at a concentration of $1\times10^{19}$ to $1\times10^{22}$ atoms/cm$^3$, preferably at a concentration of $1\times10^{19}$ to $5\times10^{20}$ atoms/cm$^3$. Then, an active layer in which a crack is not easily generated with few defects can be obtained.

Further, it is preferable to provide a barrier film that blocks contaminants such as an alkaline metal so as to wrap the transistors included in the group of elements 35 or the group of elements 35 itself. Then, the group of elements 35, which is not contaminated and has reliability improved, can be provided. It is to be noted that a silicon nitride film, a silicon nitride oxide film, a silicon oxynitride film or the like can be used for the barrier film.

Further, the thicknesses of the active layers of the transistors included in the group of elements 35 is preferably 20 to 200 nm, preferably 40 to 170 nm, more preferably 45 to 55 nm and 145 to 155 nm, and even more preferably 50 nm and 150 nm. Then, the group of elements 35, in which a crack is not easily generated even in the case of being bent, can be provided.

Further, it is preferable that crystals for forming the active layers of the transistors included in the group of elements 35 be formed so as to include a crystal boundary extending in parallel to a carrier flow direction (a channel length direction). This active layer is formed preferably by using a continuous oscillation laser, or a pulsed laser that operates at a frequency of 10 MHz or higher, preferably 60 to 100 MHz.

Further, it is preferable that the transistors included in the group of elements 35 have an S value (a sub-threshold value)

of 0.35 V/dec or less (preferably 0.09 to 0.25 V/dec, and a mobility of 10 cm$^2$/Vs or more. These characteristics can be achieved when the active layers are formed by using a continuous oscillation laser or a pulsed laser that operates at a frequency of 10 MHz or higher.

Further, the group of elements 35 has characteristics of 1 MHz or higher, preferably 10 MHz or higher (at 3 to 5 V), measured by a ring oscillator, or has a frequency characteristic per gate, 100 kHz or higher, preferably 1 MHz or higher (at 3 to 5 V).

The antenna 18 is preferably formed by a droplet discharging method with the use of a conductive paste containing nanoparticles of gold, silver, copper, or the like. The droplet discharging method is a generic term for a method of forming a pattern by discharging droplets, such as an ink-jet method and a dispenser method, and has various advantages such that a material can be used more efficiently.

The structure described above makes it possible to manufacture an RFID that has a quite small area (1 cm×1 cm).

Further, in the semiconductor device shown in the present embodiment mode, an integrated circuit that is formed by using an IC chip may be mounted on the group of elements 35. By mounting an integrated circuit that is formed by using an IC chip, the write voltage of a memory element can be controlled to be 14 V or more. Further, since the area of a write circuit, a read circuit, and the like of a memory element can be reduced, the size (area) of an RFID on which all of these circuits are mounted can be made smaller than 1 cm square (1 cm×1 cm).

Figure 5A:
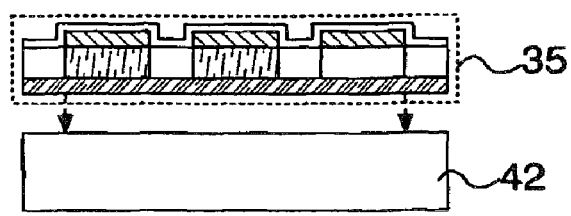
FIGS. 5A to 5D are diagrams illustrating a semiconductor device according to the present invention.
Figure 5B:
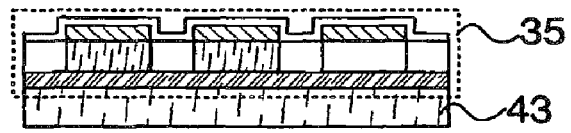

Although a substrate 42 on which a group of elements 35 is provided may be used as it is, the group of elements 35 over the substrate 42 may be peeled off (FIG. 5A) and attached to a flexible substrate 43 (FIG. 5B) in order to create added value.

The group of elements 35 can be peeled off from the substrate 42 by (1) a method of providing a metal oxide film between the substrate 42 of high heat resistance and the group of elements 35 and weakening the metal oxide film by crystallization, (2) a method of providing an amorphous silicon film containing hydrogen between the substrate 42 of high heat resistance and the group of elements 35 and removing the amorphous silicon film by laser light irradiation or etching, or (3) a method of removing the substrate 42 of high heat resistance, over which the group of elements 35 is formed, mechanically or by etching with a solution or a gas such as ClF$_3$.

In addition to the methods described above, by providing a metal layer (for example, tungsten (W), molybdenum (Mo), titanium (Ti), tantalum (Ta), or cobalt (Co)), a metal oxide film (for example, tungsten oxide (WOx), molybdenum oxide (MoOx), titanium oxide (TiOx), tantalum oxide (TaOx), or cobalt oxide (CoOx)), or a laminated structure of a metal film and a metal oxide film (for example, W and WOx, Mo and MoOx, Ti and TiOx, or Co and CoOx) that serves as a peeling layer between the substrate 42 and the group of elements 35, the substrate 42 and the group of elements 35 can be separated from each other by a physical force. For example, in the case of FIG. 11, a group of elements such as the transistor 240, the CMOS circuit 248, and the organic memory element 241 is provided over the substrate 230 with this peeling layer interposed therebetween, and then peeled off from the substrate 230. It is to be noted that the peeling physically is made easier by, before the peeling, selectively irradiating a portion except the transistor 240, the CMOS circuit 248, and the organic memory element 241 with laser light to expose the peeling layer. In addition, it is also possible to peel off the group of elements physically from the substrate after selectively forming an opening to expose the peeling layer and then removing a portion of the peeling layer with an etching agent such as halogen fluoride (for example, ClF$_3$).

In addition, the peeled group of elements 35 may be attached to the flexible substrate 43 with the use of a commercial adhesive such as an epoxy resin adhesive and an adhesive using a resin additive.

Figure 5C:
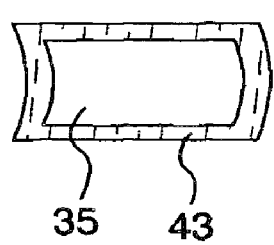
Figure 5D:
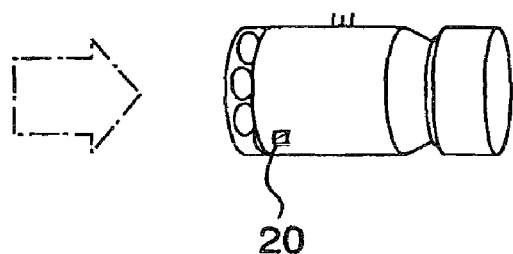

As described above, a semiconductor device that is thin, lightweight, and is not easily broken even in the case of being dropped can be provided by attaching the group of elements 35 to the substrate 43. Also, since the flexible substrate 43 has flexibility, the semiconductor device can be attached onto a curved or odd-shaped surface so that various applications are realized. For example, a wireless tag that is one mode of the semiconductor device 20 according to the present invention can be closely attached to a curved surface such as a medicine bottle (FIGS. 5C and 5D). Moreover, an inexpensive semiconductor device can be provided when the substrate 42 is reused.

It is to be noted that the present embodiment mode can be carried out freely in combination with the embodiment modes described above.

Embodiment Mode 5

Figure 6A:
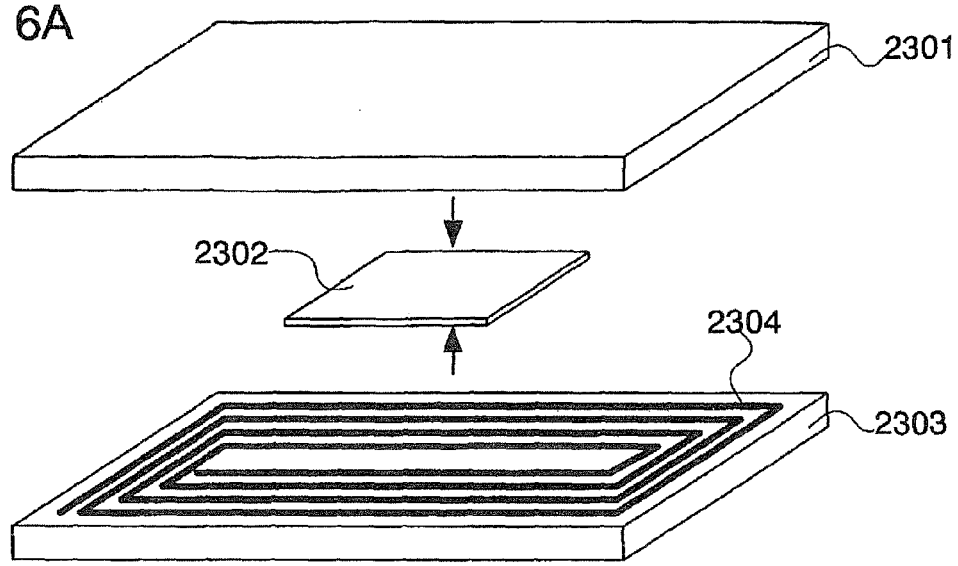
FIGS. 6A to 6C are diagrams illustrating a semiconductor device according to the present invention.

In the present embodiment, a case of forming a flexible semiconductor device by a peeling process will be described (FIG. 6A). A semiconductor device includes a flexible protective layer 2301, a flexible protective layer 2303 including an antenna 2304, and a group of elements 2302 formed by a peeling process. The antenna 2304 formed over the protective layer 2303 is electrically connected to the group of elements 2302. In the shown structure, the antenna 2304 is formed only over the protective layer 2303. However, the present invention is not restricted to this structure, and the antenna 2304 may be formed also over the protective layer 2301. It is to be noted that a barrier film composed of a silicon nitride film is preferably formed between the group of elements 2302 and the protective layers 2301 and 2303. Then, a semiconductor device in which the group of elements 2302 is not contaminated with reliability improved can be provided.

It is preferable that the antenna 2304 be formed by using silver, copper, or a metal plated with them. The group of elements 2302 and the antenna 2304 are connected by performing UV treatment or supersonic treatment with the use of an anisotropic conductive film. However, the present invention is not restricted to this method, and various methods can be employed as well.

Figure 6B:
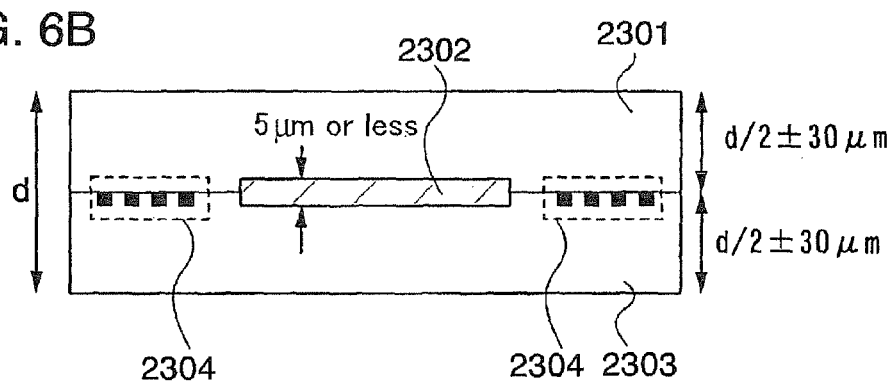

It is preferable that the group of elements 2302 sandwiched between the protective layers 2301 and 2303 be formed so as to have a thickness of 5 μm or less, preferably 0.1 to 3 μm (FIG. 6B). When the thickness of the stacked protective layers 2301 and 2303 is d, the thickness of each of the protective layers 2301 and 2303 is preferably (d/2)±30 μm, and more preferably (d/2)±10 μm. Further, it is preferable that the thickness of each of the protective layers 2301 and 2303 be 10 to 200 μm. Moreover, the group of elements 2302 has an area of 5 mm square (25 mm$^2$) or less, and preferably 0.3 to 4 mm square (0.09 to 16 mm$^2$).

The protective layers 2301 and 2303 are each formed by using an organic resin material, and so, are highly resistant to bending. The group of elements 2302 itself formed by a peeling process is also highly resistant to bending as compared with a single crystalline semiconductor. Further, since the group of elements 2302 and the protective layers 2301 and 2303 can be closely attached to each other without any space, a completed semiconductor device itself is also highly resistant to bending. The group of elements 2302 surrounded by these protective layers 2301 and 2303 may be disposed on the surface of or inside another object or implanted in paper.

Figure 6C:
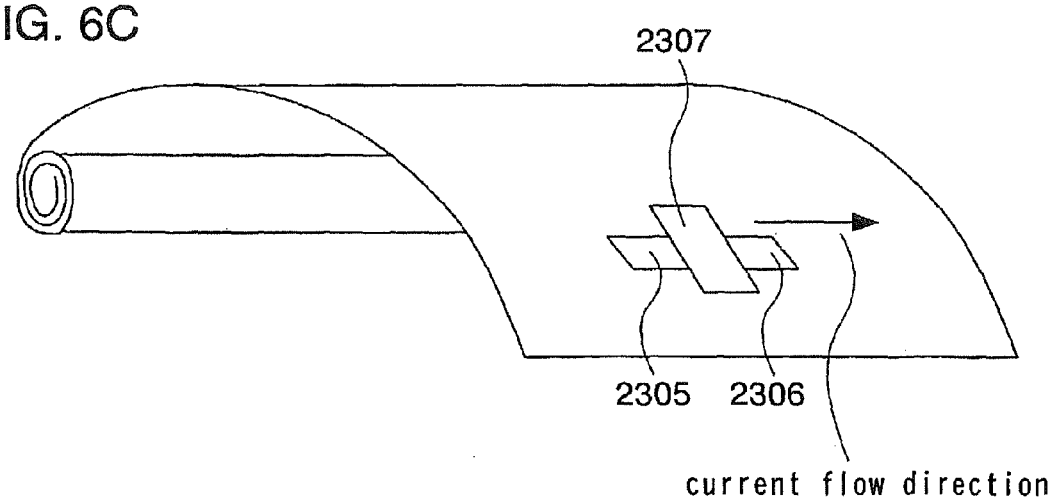

Now, a case of attaching the group of elements formed by a peeling process to a curved substrate will be described (FIG. 6C). In the drawing, one transistor selected from the group of elements formed by a peeling process is shown. This transistor is formed linearly in a current flow direction. Namely, a drain electrode 2305, a gate electrode 2307, and a source electrode 2306 are located linearly. Then, the current flow direction and the direction in which the substrate draws an arc are arranged to be perpendicular to each other. With this arrangement, even when the substrate is bent to draw an arc, the influence of stress is small, and variation in characteristics of the transistors included in the group of elements can be suppressed.

In order to prevent active elements such as a transistor from being broken due to stress, it is preferable that the area of active regions (silicon island portion) of the active elements be made to be 1 to 50% (preferably 1 to 30%) with respect to the entire area of the substrate. In a region where there is no active element such as a TFT, a base insulating film material, an interlayer insulating film material and a wiring material are mainly provided. It is preferable that the area other than the active regions of a transistor and the like be 60% or more of the entire area of the substrate. Accordingly, a highly integrated semiconductor device that can be easily bent at the same time can be provided.

It is to be noted that the present embodiment mode can be carried out freely in combination with the embodiment modes described above.

Embodiment Mode 6

In addition, when an organic memory is integrated in a semiconductor device according to the present invention, it is preferable to provide features as described below.

In order to operate at the operating frequency of a logic circuit in the semiconductor devices that send and receive data without contact such as a wireless tag (typically, 10 kHz to 1 MHz), it is preferable that the read time be 1 nsec to 100 usec. In the present invention, a read time of 100 usec or less can be achieved since it is not necessary to change a property of the organic compound in a read operation.

The write time is preferably short as a matter of course. However, it is unlikely that a write operation is often performed, and the permissible range of the write time is 100 nsec/bit to 10 msec/bit depending on applications. For example, in the case of writing 256 bit, a time period of 2.56 seconds is required at 10 msec/bit. In the present invention, a read time of 10 msec/bit or less can be achieved although it is necessary to change to a property of the organic compound in a write operation and the write operation requires more time than a read operation. The write time can be reduced by increasing the write voltage or performing parallelization of writing.

It is preferable that the storage capacity of the memory be approximately 64 bit to 64 Mbit. As a use of the semiconductor device such as the wireless chip, in the case of storing only UID (Unique Identifier) and another slight information in the semiconductor device and using another file sever for main data, the memory needs only have a storage capacity of approximately 64 bit to 8 kbit. In the case of storing data such as history information in the semiconductor device, it is preferable that the storage capacity the memory be larger, and be approximately 8 kbit to 64 Mbit.

In addition, the communication distance of the semiconductor device such as the wireless chip is closely related to the power consumption of the semiconductor device. Commonly, a larger communication distance can be achieved as the power consumption is smaller. In particular, in a read operation, it is preferable that the power consumption be made 1 mW or less. In a write operation, the communication distance can be allowed to be short depending on applications, and the power consumption is allowed to be larger than in a read operation, and for example, is preferably made to be 5 mW or less. In the present invention, the power consumption of the organic memory in a read operation can achieve 10 uW to 1 mW although the power consumption of course depends on the storage capacity and the operating frequency. In a write operation, the power consumption is increased since a higher voltage is needed than in a read operation. Although the power consumption in a write operation also depends on the storage capacity and the operating frequency, the power consumption can achieve 50 uW to 5 mW.

It is preferable that the area for a memory cell be small, and an area of 100 nm square to 30 um square can be achieved. In a passive type in which a memory cell has no transistor, the area for the memory cell is determined by the width of a wiring, and thus, a small-sized memory cell that is comparable with the minimum process size can be achieved. In addition, in an active type in which a memory cell has one transistor, a smaller area for the memory cell can be achieved as compared with a DRAM including a capacity element and an SRAM using a plurality of transistors although the area is increased for arranging the transistor. The achievement of an area of 30 um square or less for a memory cell makes it possible to make the area for a memory cell 1 mm square or less in the case of a 1 kbit memory. Further, the achievement of an area of approximately 100 nm square for a memory cell makes it possible to make the area for a memory cell 1 mm square or less in the case of a 64 Mbit memory. Accordingly, the area of the semiconductor device can be reduced.

It is to be noted that these features of the organic memory depend on characteristics of a memory element. As for the characteristics of a memory element, it is preferable that the voltage required for the case of electrical writing be low to such a degree that writing is not carried out in reading, and the voltage is preferably 5 to 15 V, more preferably 5 to 10 V. Further, it is preferable that the current value that flows in the memory element in writing be made to be approximately 1 nA to 30 uA. This given value makes it possible to reduce power consumption and make a boost circuit smaller to reduce the area of the semiconductor device. It is preferable that the time required for applying a voltage to the memory element to change a property of the memory element be made to be 100 nsec to 10 msec in response to the write time of the organic memory. It is preferable that the area of the memory element be 100 inn square to 10 um square. This given value makes it possible to achieve a small-sized memory cell and thus reduce the area of the semiconductor device.

It is to be noted that the present embodiment mode can be carried out freely in combination with the embodiment modes described above.

Embodiment Mode 7

The application range of the semiconductor device according to the present invention is wide. For example, a wireless tag that is one mode of the semiconductor device 20 according to the present invention can be provided and used for bills, coins, securities, certificates, bearer bonds, containers for wrapping, books, storage mediums, personal belongings, vehicles, groceries, garments, health products, daily commodities, medicines, electronic devices, and the like.

Figure 7A:
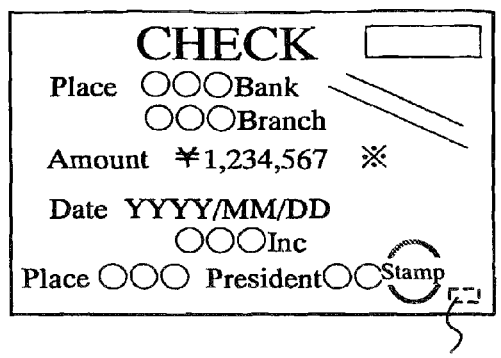
FIGS. 7A to 7H are diagrams illustrating usage patterns of a semiconductor device according to the present invention.
Figure 7B:
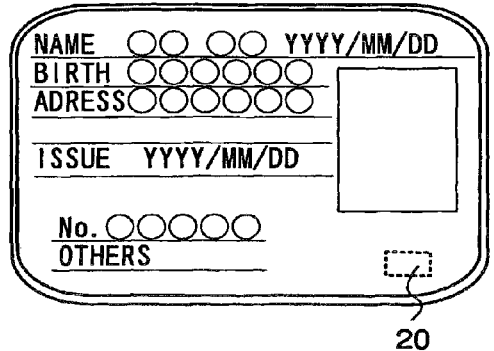
Figure 7C:
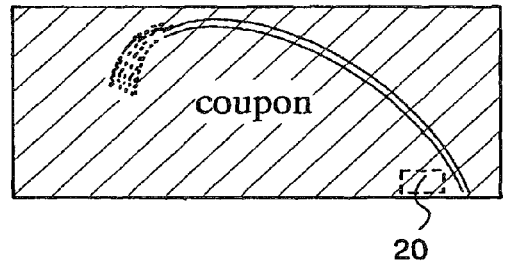
Figure 7D:
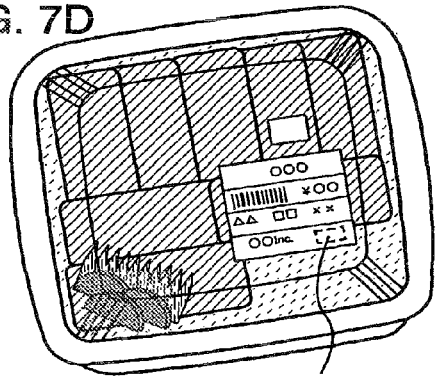
Figure 7E:
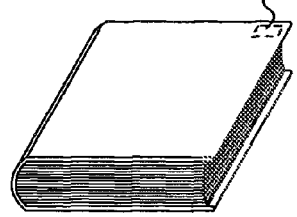
Figure 7F:
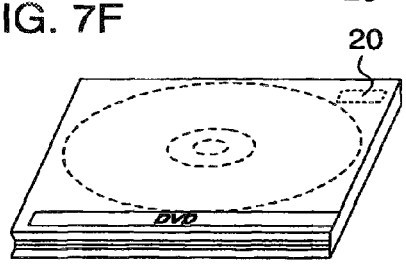
Figure 7G:
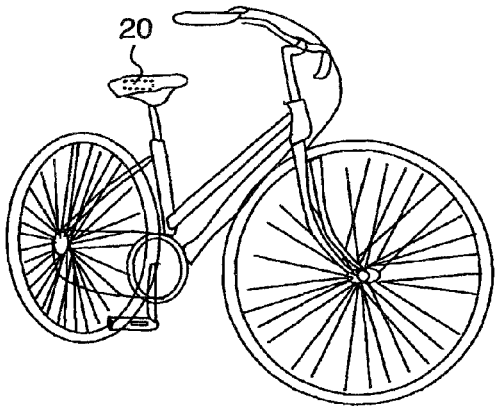
Figure 7H:
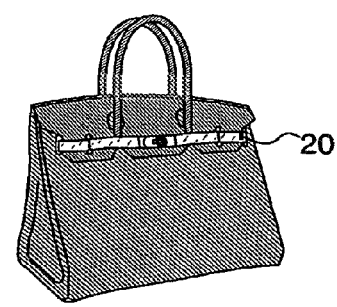

The bills and coins are money that circulates in the market, and includes one that can be used in the same way as money in a specific area (cash voucher), a commemorative coin, and the like. The securities indicate a check, certificate, a promissory note, and the like (FIG. 7A). The certificates indicate a license, a resident's card, and the like (FIG. 7B). The bearer bonds indicate a stamp, a rice coupon, various gift coupons, and the like (FIG. 7C). The containers for wrapping indicate a wrapper for a packed lunch and the like, a plastic bottle, and the like (FIG. 7D). The books indicates a magazine, a dictionary, and the like (FIG. 7E). The storage mediums indicate a DVD software, a video tape, and the like (FIG. 7F). The vehicles indicate a wheeled vehicle such as a bicycle, a ship, and the like (FIG. 7G). The personal belongings indicate to a bag, glasses, and the like (FIG. 7H). The groceries indicate foods, beverages, and the like. The garments indicate clothes, shoes, and the like. The health products indicate a medical apparatus, a health appliance, and the like. The daily commodities indicate furniture, lighting apparatus, and the like. The medicines indicate a drug, an agricultural chemical, and the like. The electronic devices indicate a liquid crystal display device, an EL display device, television sets (a television receiver and a thin television receiver), a cellular phone, and the like.

By providing wireless tags for bills, coins, securities, certificates, bearer bonds, and the like, falsification can be prevented. In addition, by providing wireless tags for containers for wrapping, books, storage mediums, personal belongings, groceries, daily commodities, electronic devices, and the like, an inspection system and a system of a rental store, and the like can be facilitated. By providing wireless tags for vehicles, health products, medicines, and the like, falsification and theft can be prevented, and an error in taking a drug can be prevented in the case of the medicines. The wireless tag can be provided by being attached to the surface of an article or being implanted in an article. For example, the wireless tag can be implanted in paper in the case of a book, and can be implanted in an organic resin in the case of a package composed of the organic resin.

Figure 8A:
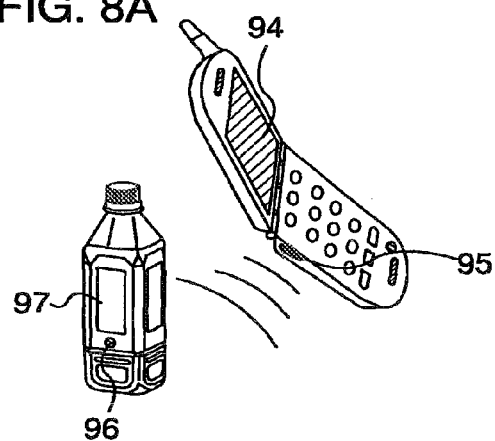
FIGS. 8A and 8B are diagrams illustrating usage patterns of a semiconductor device according to the present invention.
Figure 8B:
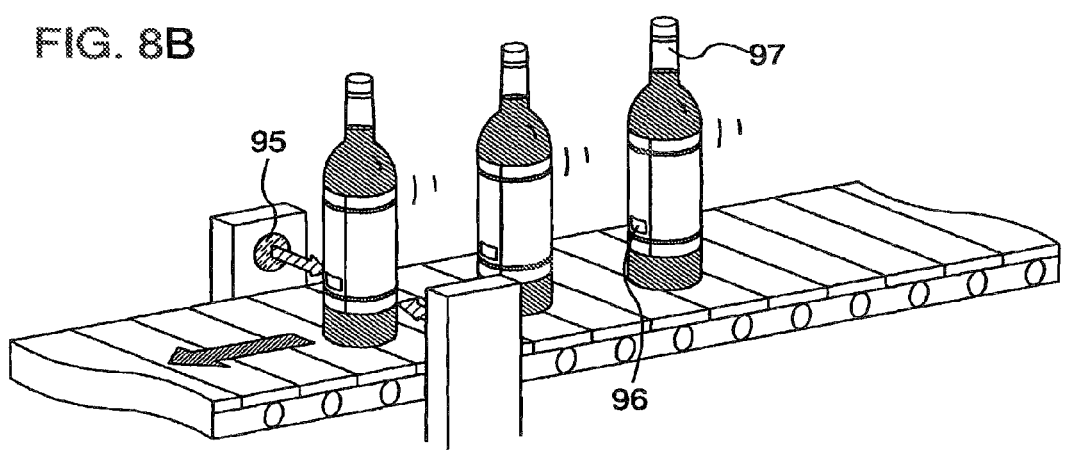

As described above, highly functional systems can be obtained by applying wireless tags to management of articles and a distribution system. For example, there is a case where a reader/writer 95 is provided on a side of a portable terminal including a display portion 94, and a wireless tag 96 that is one mode of the semiconductor device according to the present invention is provided on a side of a product 97 (FIG. 8A). In this case, when the wireless tag 96 is held over the reader/writer 95, data of the product 97 such as a primary material, a country of origin, and a history of distribution are displayed on the display portion 94. Further, as another example, there is a case where a reader/writer 95 is provided beside a conveyor belt (FIG. 8B). In this case, inspection of the product 97 can be easily performed.

It is to be noted that the present embodiment mode can be carried out freely in combination with the embodiment modes described above.

Embodiment 1

In the present embodiment, a result of writing data by electric action to an organic memory element manufactured over a substrate will be described.

The organic memory element is an element for which a first conductive layer, a first organic compound layer, a second organic compound layer, and a second conductive layer are sequentially stacked over a substrate. The first conductive layer, the first organic compound layer, the second organic compound layer, and the second conductive layer are formed by using a compound of silicon oxide and indium tin oxide, 4,4'-bis[N-(3-methylphenyl)-N-phenylamino]biphenyl (may be abbreviated as TPD), 4,4'-bis[N-(1-naphthyl)-N-phenylamino]biphenyl (may be abbreviated as α-NPD), and aluminum, respectively. The first organic compound layer and the second organic compound layer are formed so as to have a film thickness of 10 nm and 50 nm, respectively. The size of the element is 2 mm×2 mm.

First, the results of measuring current-voltage characteristics of the organic compound element before and after writing data by electric action will be described with reference to FIG. 13.

Figure 13:
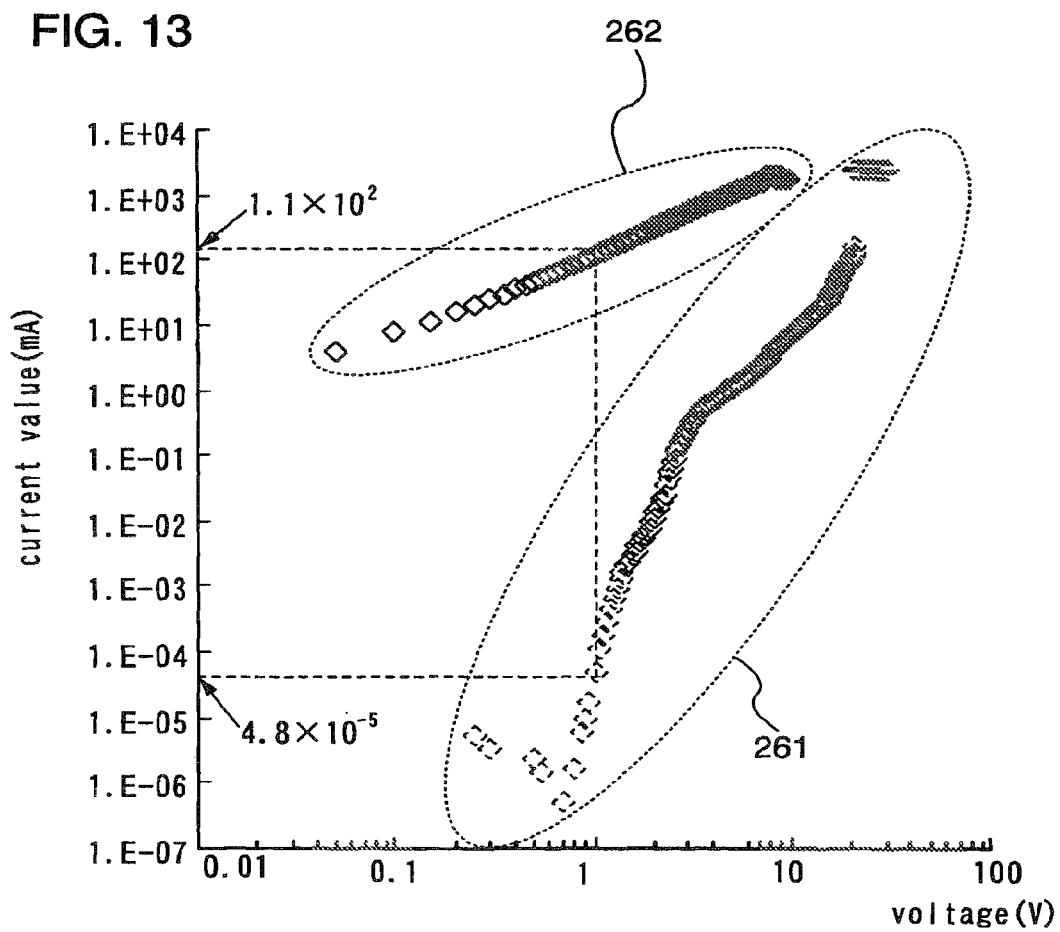
FIG. 13 is a diagram of measuring current-voltage characteristics of an organic memory element in a semiconductor device according to the present invention.

In FIG. 13, the horizontal axis indicates a voltage value, the vertical axis indicates a current value, plots 261 show current-voltage characteristics of the organic memory element before writing data by electric action, and plots 262 show current-voltage characteristics of the organic memory element after writing data by electric action. The electric action is performed by increasing voltage gradually from 0 V. As shown by the plots 261, the current value increases gradually as the voltage is increased, and it is determined that the current value drastically increases approximately at 20 V. Namely, this drastic increase shows that writing in this element can be carried out at 20 V. Therefore, the curve in the range of 20 V or less, the plots 261, shows current-voltage characteristics of a memory cell into which writing is not carried out, and the plots 262 show current-voltage characteristics of the memory cell into which writing is carried out.

Further, FIG. 13 shows a substantial change in the current-voltage characteristics of the organic memory element before and after writing data. For example, at an applied voltage of 1 V, the current value before writing data is $4.8 \times 10^{-5}$ mA while the current value after writing data is $1.1 \times 10^2$ mA. Accordingly, writing data results in a seven-digit change in the current value.

As described above, the resistance value of the organic memory element is changed after writing data, and the organic memory element can serve as a memory circuit when the change in the resistance value of this organic memory element is read in voltage or current.

Further, in the case of using the organic memory element described above as a memory circuit, a predetermined voltage value (a voltage value that is enough to keep from short-circuiting) is applied to the organic memory element each time a data reading operation is performed, and reading of the resistance value is carried out. Therefore, the current-voltage characteristics of the organic memory element are required to be characteristics that are not changed even when a reading operation is repeatedly conducted, that is, even when a predetermined voltage value is repeatedly applied.

Now, the result of measuring current-voltage characteristics of an organic memory element after reading data will be described with reference to FIG. 14.

In this experiment, current-voltage characteristics of the organic memory element are measured each time a data reading operation is performed once. Since the data reading operation is performed five times in total, the current-voltage characteristics of the organic memory element are measured five times in total. This measurement of current-voltage characteristics is conducted on two organic memory elements of an organic memory element that has a resistance value changed by carrying out writing of data by electric action and an organic memory element that has an unchanged resistance value.

Figure 14:
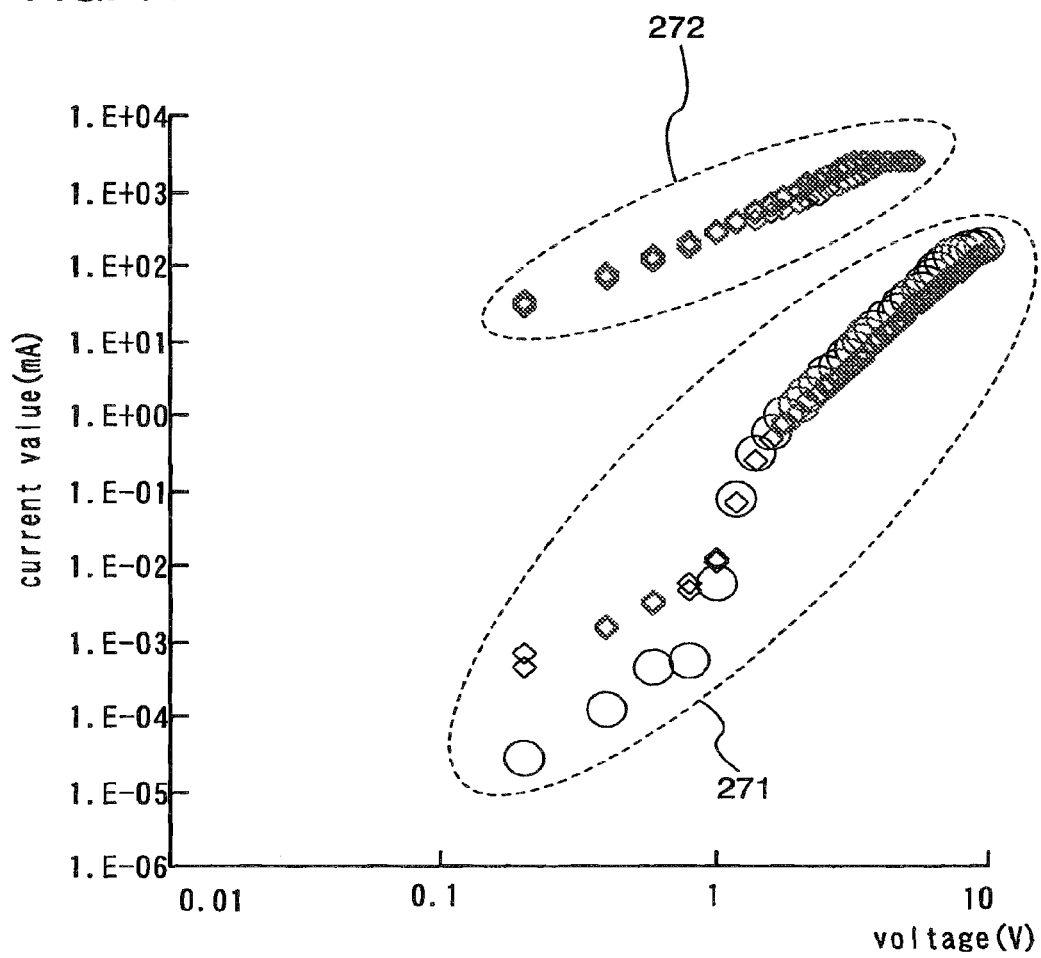
FIG. 14 is a diagram of measuring current-voltage characteristics of the organic memory element in a semiconductor device according to the present invention.

In FIG. 14, the horizontal axis indicates a voltage value, the vertical axis indicates a current value, plots 271 show current-voltage characteristics of the organic memory element that has the resistance value changed by carrying out writing of data by electric action, and plots 272 show current-voltage characteristics of the organic memory element that has the unchanged resistance value.

As will be appreciated from the plots 271, the current-voltage characteristics of the organic memory element before writing show especially favorable repeatability at a voltage value of 1 V or more. Similarly, as will be appreciated from the plots 272, the current-voltage characteristics of the organic memory element that has the resistance value changed by carrying out writing of data show especially favorable repeatability at a voltage value of 1 V or more.

From the results described above, the current-voltage characteristics are not changed even when a data reading operation is repeatedly conducted more than once. Accordingly, the organic memory element described above can be used as a memory circuit.

Embodiment 2

Figure 16A:
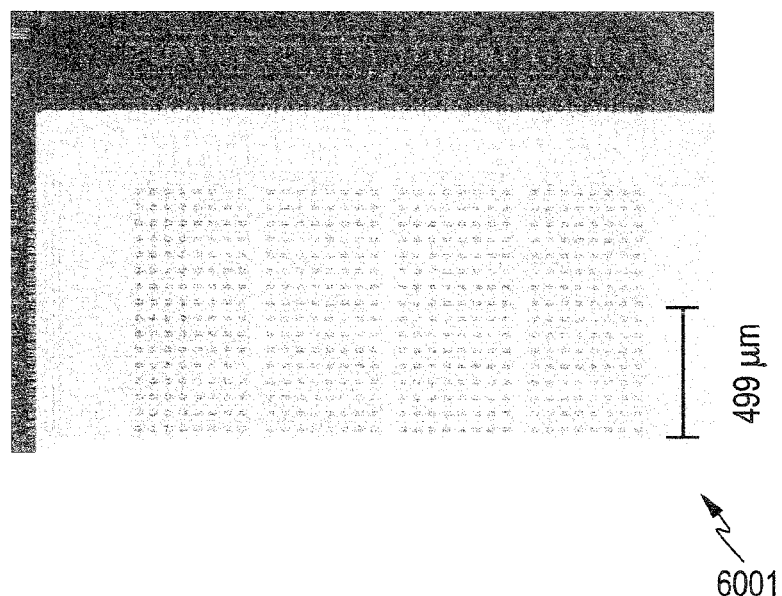
FIGS. 16A and 16B are respectively an optical microscope image and a pattern diagram of a semiconductor device according to the present invention.

In the present embodiment, a semiconductor device according to the embodiment mode described above will be described with reference to FIGS. 16A and 16B. FIG. 16A is a photograph of a semiconductor device 6001 observed with an optical microscope, and FIG. 16B is a pattern diagram of FIG. 16A.

Figure 16B:
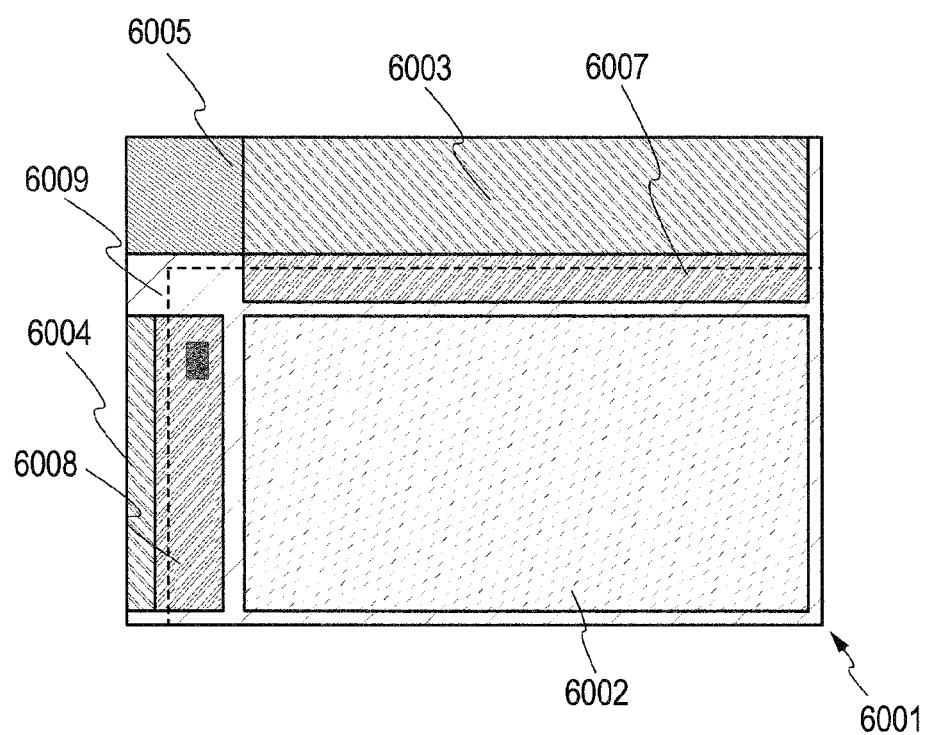

As shown in FIG. 16B, a memory cell array 6002 in which memory cells are arranged in a matrix, a portion of a column decoder 6003, a portion of a row decoder 6004, selectors 6007 and 6008, and a read/write circuit 6005 in the semiconductor device 6001 are observed. Further, a dashed line 6009 shown in FIG. 16B indicates a second conductive layer of an organic memory element.

Figure 17:
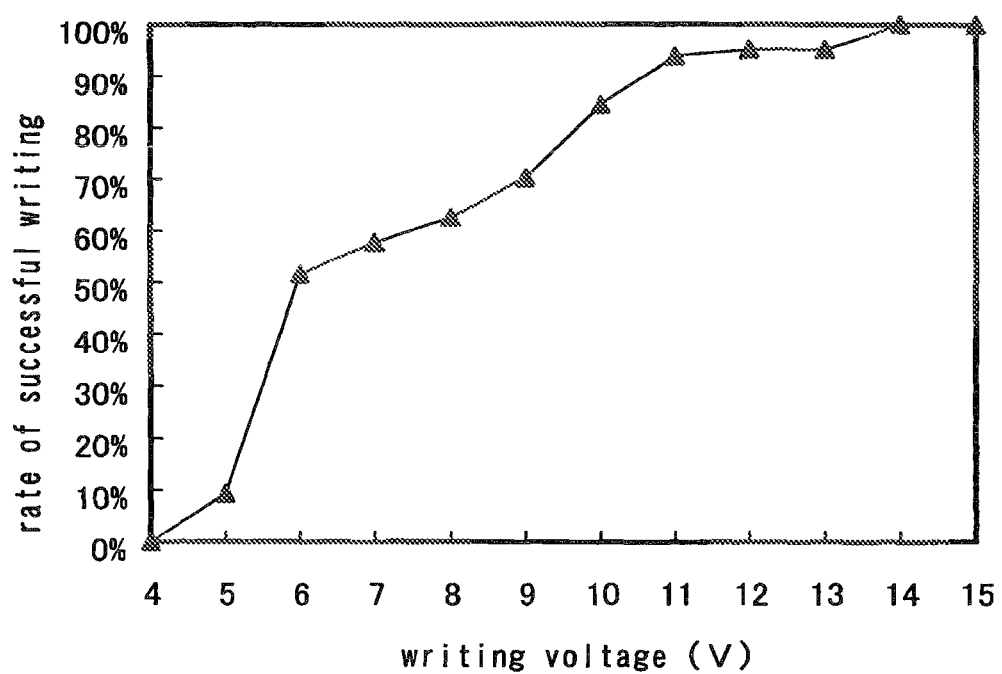
FIG. 17 is a diagram showing write characteristics of the semiconductor device according to the present invention.

FIG. 17 shows a write characteristic of the semiconductor device shown in FIGS. 16A and 16B, where the size of a memory cell in a horizontal plane is 5 μm×5 μm, and the write time is 100 ms. It is to be noted that writing is carried out here in such a way that a voltage is applied to an organic memory element to short-cirduit the organic memory element. As for the structure of the organic memory element, a first electrode, an organic compound layer, and the second conductive layer are formed by using titanium, a-NPD, and aluminum, respectively. Writing of data is carried out by applying a pulse voltage to this organic memory element for 100 ms. It is to be noted that the organic memory element here includes a thin film transistor and a memory element.

In FIG. 17, the horizontal axis indicates a pulse voltage, and the vertical axis indicates a rate of successful writing at the pulse voltage or less (success rate). Writing is started when the write voltage is 5 V, and writing can be carried out in 6 (9.38%) out of 64 memory cells. Although the 64 memory cells are used here, the number of memory cells is not limited to 64. For example, only one memory cell can serve as a memory. Further, writing can be carried out in 33 (52%) of the 64 memory cells in the semiconductor device when the write voltage is 6 V, writing can be carried out in 45 (70%) of the 64 memory cells in the semiconductor device when the write voltage is 9 V, writing can be carried out in 60 (93%) of the 64 memory cells in the semiconductor device when the write voltage is 11 V, and the 64 memory cells (100%) in the semiconductor device are successful in writing when the write voltage is 14 V.

It is to be noted that writing is possible also when the write time in this case is 10 to 100 ms. Further, writing is also possible for a short time of 10 ms or less depending on the structure of the memory cells.

From the result described above, writing into the memory cells shown in the present embodiment is possible at a write voltage of 5 to 14 V.

Embodiment 3

In the present embodiment, current-voltage characteristics obtained when writing of data is carried out electrically in an organic memory element manufactured over a substrate will be described with reference to FIGS. 18A and 18B. It is to be noted that writing is carried out here in such a way that a voltage is applied, to an organic memory element to short-circuit the organic memory element. In addition, in each of FIGS. 18A and 18B, the horizontal axis indicates a voltage that is applied to the organic memory element, and the vertical axis indicates a current value that flows in the organic memory element.

The organic memory element here is formed in such away that a first conductive layer is formed on a glass substrate by sputtering, an organic compound layer is formed on the first conductive layer by evaporation, and a second conductive layer is formed on the organic compound layer by evaporation. The size of the organic memory element formed here in the horizontal plane is 20 μm×20 mm.

Figure 18A:
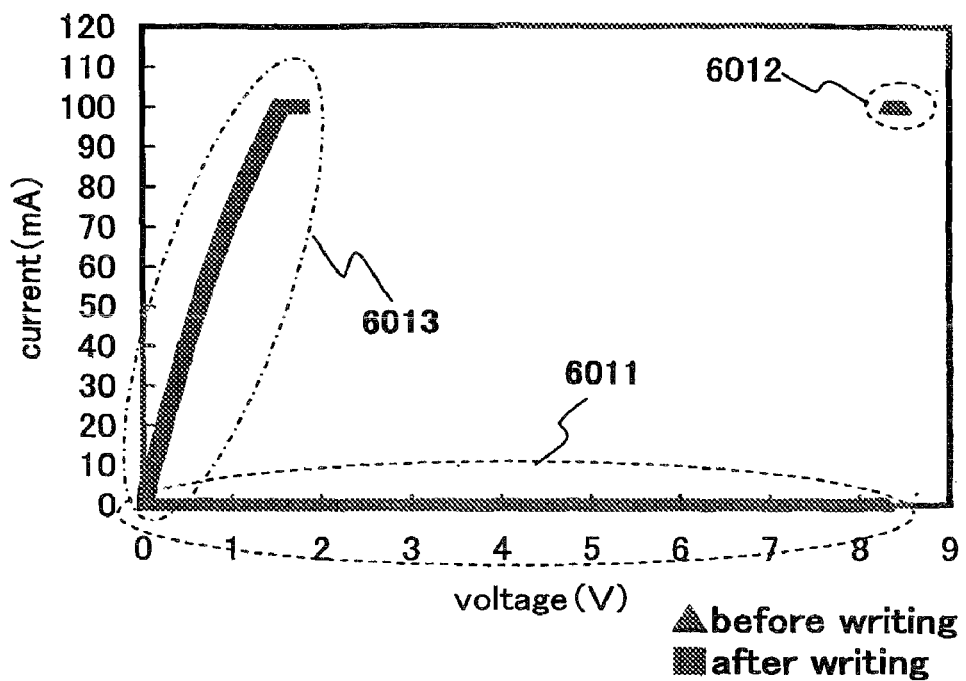
FIGS. 18A and 18B are diagrams showing current-voltage characteristics of semiconductor devices according to the present invention.

FIG. 18A shows current-voltage characteristics of an organic memory element, where the first conductive layer, the organic compound layer, the second conductive layer are formed by using titanium, a-NPD, and aluminum. It is to be noted that the first conductive layer, the organic compound layer, the second conductive layer are respectively 100 nm, 10 nm, and 200 nm in thickness.

Figure 18B:
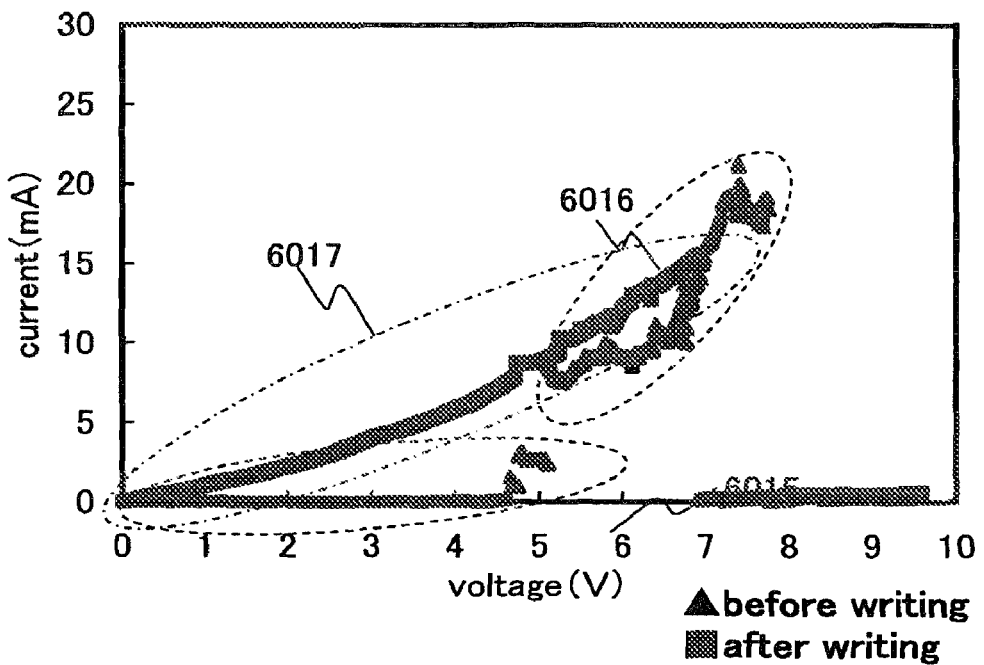

FIG. 18B shows current-voltage characteristics of an organic memory element, where the first conductive layer, the organic compound layer, the second conductive layer are formed by using ITO containing silicon oxide, a-NPD, and aluminum. It is to be noted that the first conductive layer, the organic compound layer, the second conductive layer are respectively 110 nm, 10 nm, and 200 nm in thickness.

In FIG. 18A, plots 6011 show current-voltage characteristics of the organic memory element before writing data, and plots 6012 shows current-voltage characteristics of the organic memory element immediately after writing data, and plots 6013 show current-voltage characteristics for the case of applying a voltage the organic memory element in which data is written electrically. The write voltage in this case 8.29 V, at which the write current is 0.16 mA.

In FIG. 18B, plots 6015 show current-voltage characteristics of the organic memory element before writing data electrically, and plots 6012 shows current-voltage characteristics of the organic memory element immediately after writing data, and plots 6013 show current-voltage characteristics for the case of applying a voltage the organic memory element in which data is written electrically. The write voltage in this case 4.6 V, at which the write current is 0.24 mA. As described above, writing into the organic memory element disclosed in the present invention is possible at a low voltage, and the current value in the writing is also small. Therefore, the power consumption for writing into the organic memory element can be reduced.

When FIGS. 18A and 18B are compared, as shown in FIG. 18A, almost no current flows at less than a certain voltage, in this case, at less than 8.29 V in the organic memory element that has the first conductive layer formed by the titanium layer. However, at more than 8.29 V, the current value of the organic memory element drastically changes so that writing of data is carried out, and it is thus determined that writing and reading are easily carried out.

On the contrary, current gradually flows around 4.5 V in the organic memory element that has the first conductive layer formed by using ITO containing silicon oxide. Namely, current flows even before writing. In addition, the I-V curve after writing is not linear, and further, the resistance value is larger as compared with the organic memory element that has the first conductive layer formed by using titanium after writing. Namely, the organic memory element that has the first conductive layer formed by using ITO containing silicon oxide has a small difference in resistance value before and after writing, and thus, the memory characteristics can be said to be bad.

In order to provide an element that is excellent in memory characteristics, it is preferable that the first conductive layer be metal layer, typically, a titanium layer.

Embodiment 4

In the present embodiment, the result of observing a cross section of an organic memory element after writing with a TEM (Transmission Electron Microscope) will be described with reference to the accompanying drawings. It is to be noted that writing is carried out here in such a way that a voltage is applied to an organic memory element to short-circuit the organic memory element.

First, an organic memory element is formed in such away that a first conductive layer that is 110 nm in thickness is formed on a glass substrate by sputtering, an organic compound layer that is 35 nm in thickness is formed on the first conductive layer by evaporation, and a second conductive layer that is 270 nm in thickness is formed on the organic compound layer by evaporation. The first conductive layer, the organic compound layer, and the second conductive layer are formed by using ITO containing silicon oxide, TPD, and aluminum here, respectively. It is to be noted that the size of the organic memory element in the horizontal plane is 2 mm×2 mm.

Next, a write voltage is applied to the organic memory element to write data in the organic memory element, and a cross section of the organic memory element is observed with a TEM. It is to be noted that a sample for the TEM is prepared by a process with FIB (Focus Ion beam) to be 0.1 μm in width. For the FIB, a Ga ion source is used at 30 kV.

Figure 19A:
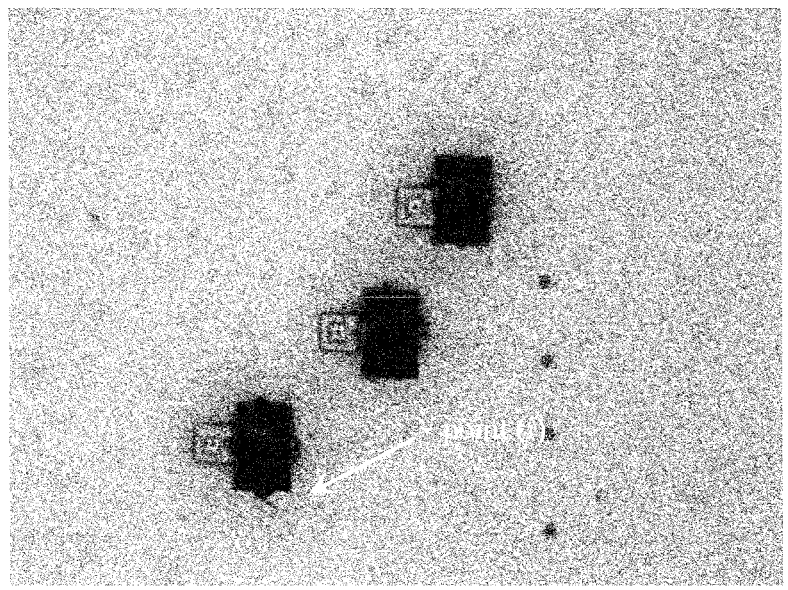
FIGS. 19A and 19B are an optical microscope image and a cross-sectional TEM image of an organic memory element according to the present invention after writing of data.
Figure 19B:
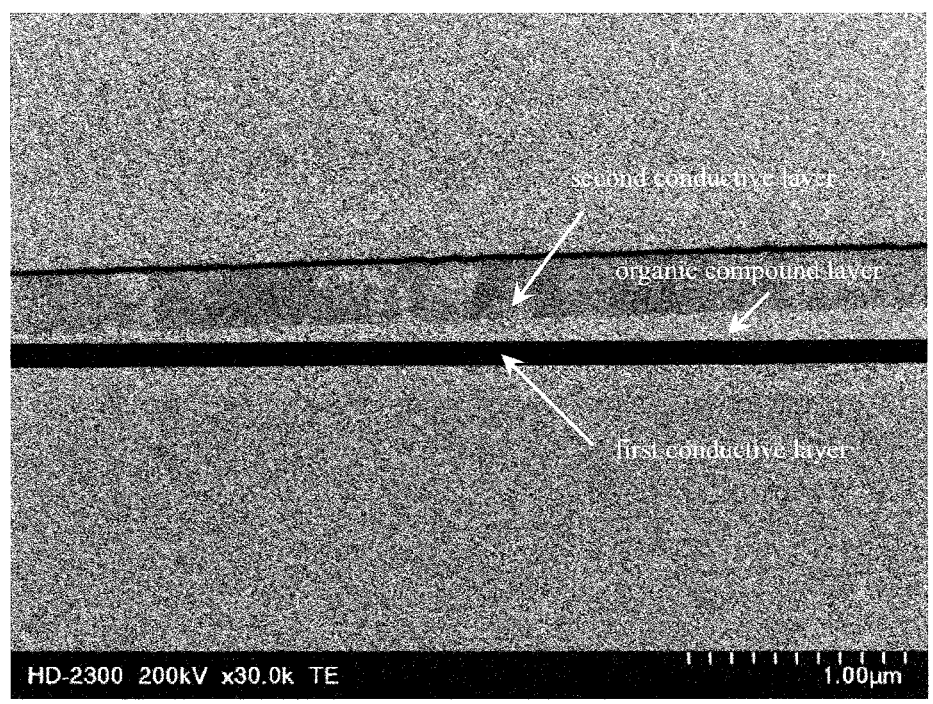
Figure 20A:
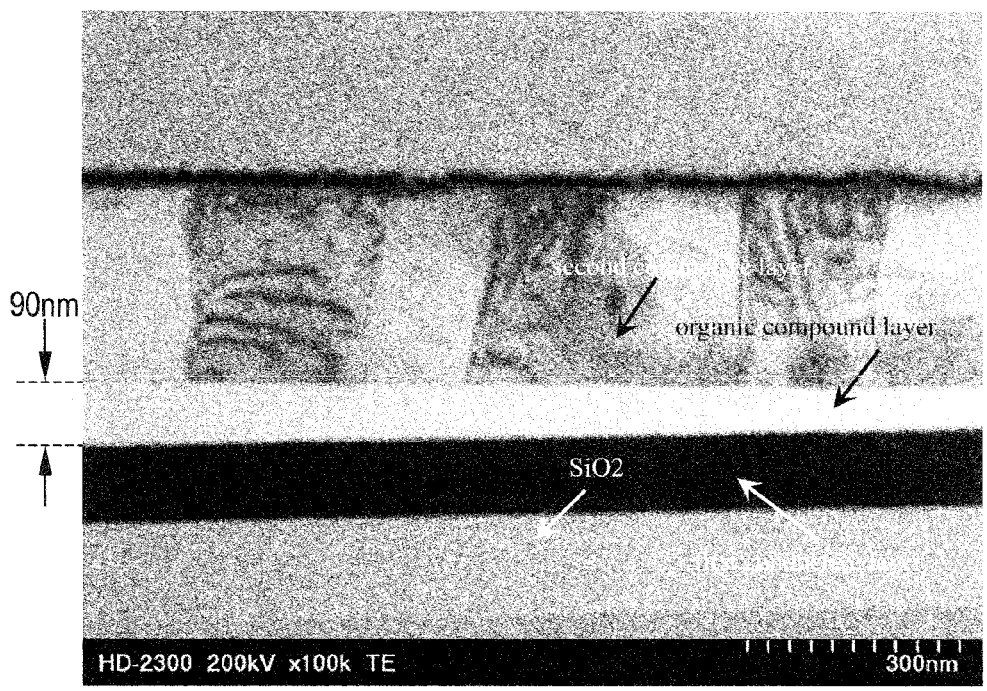
FIGS. 20A and 20B are cross-sectional TEM images of the organic memory element according to the present invention after the writing of data.
Figure 20B:
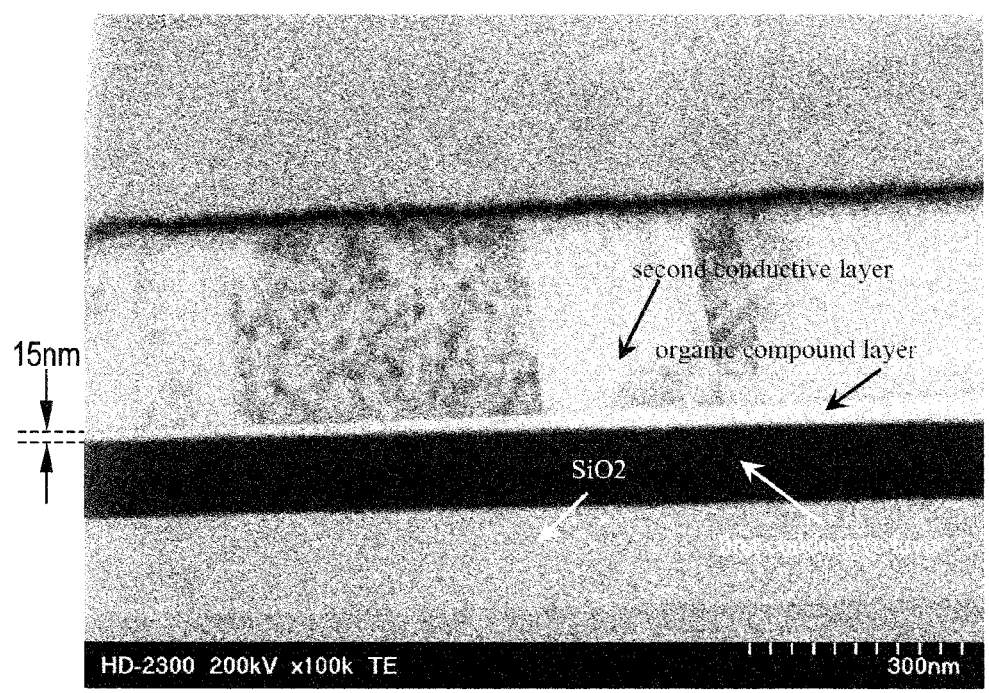
Figure 21:
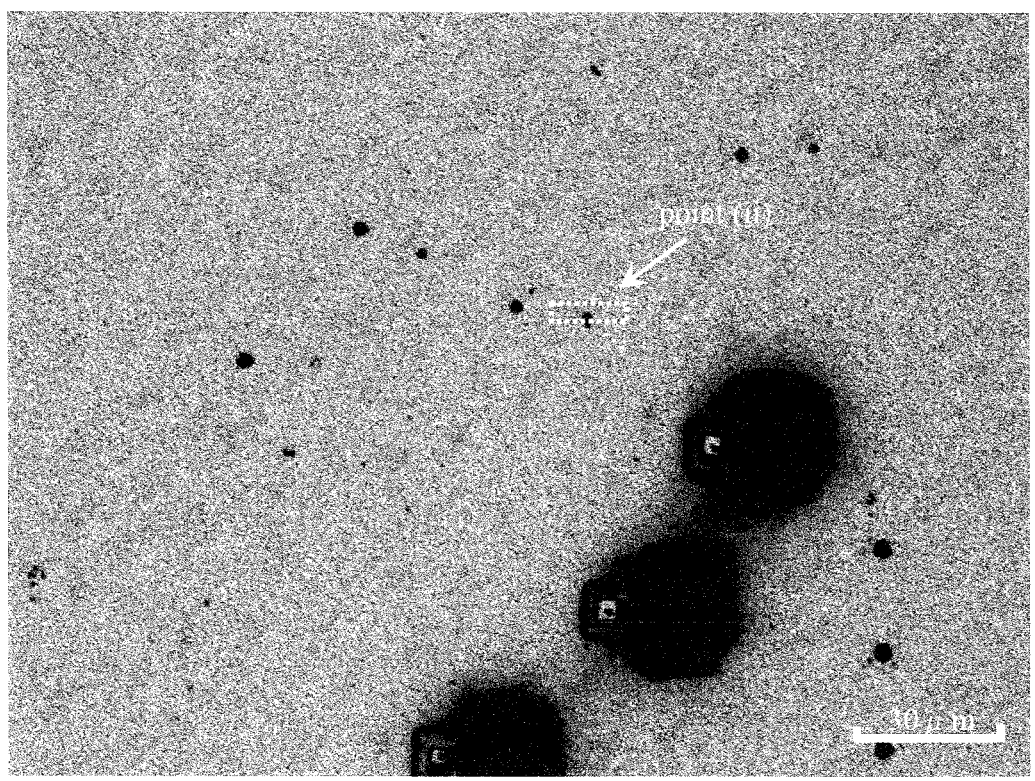
FIG. 21 is an optical microscope image of the organic memory element according to the present invention after the writing of data.
Figure 22A:
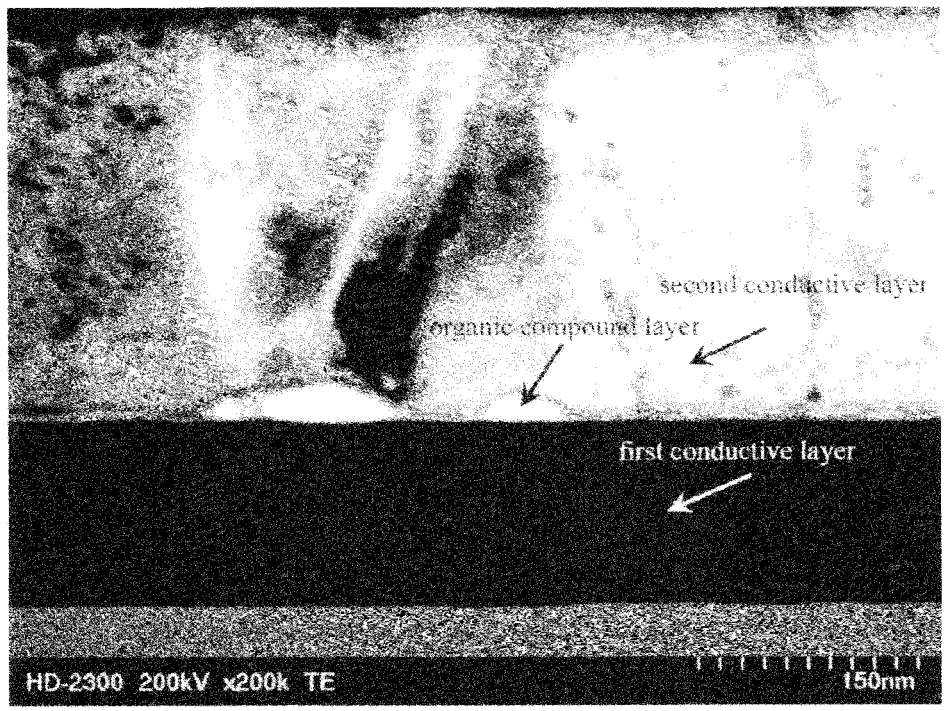
FIGS. 22A and 22B are cross-sectional TEM images of the organic memory element according to the present invention after the writing of data.
Figure 22B:
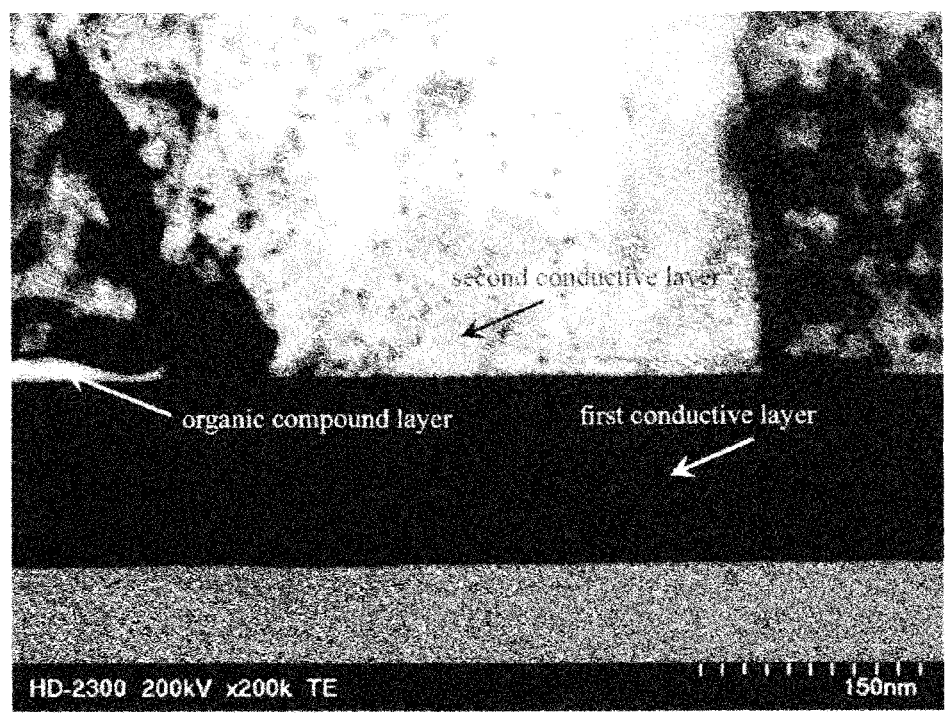
Figure 23:
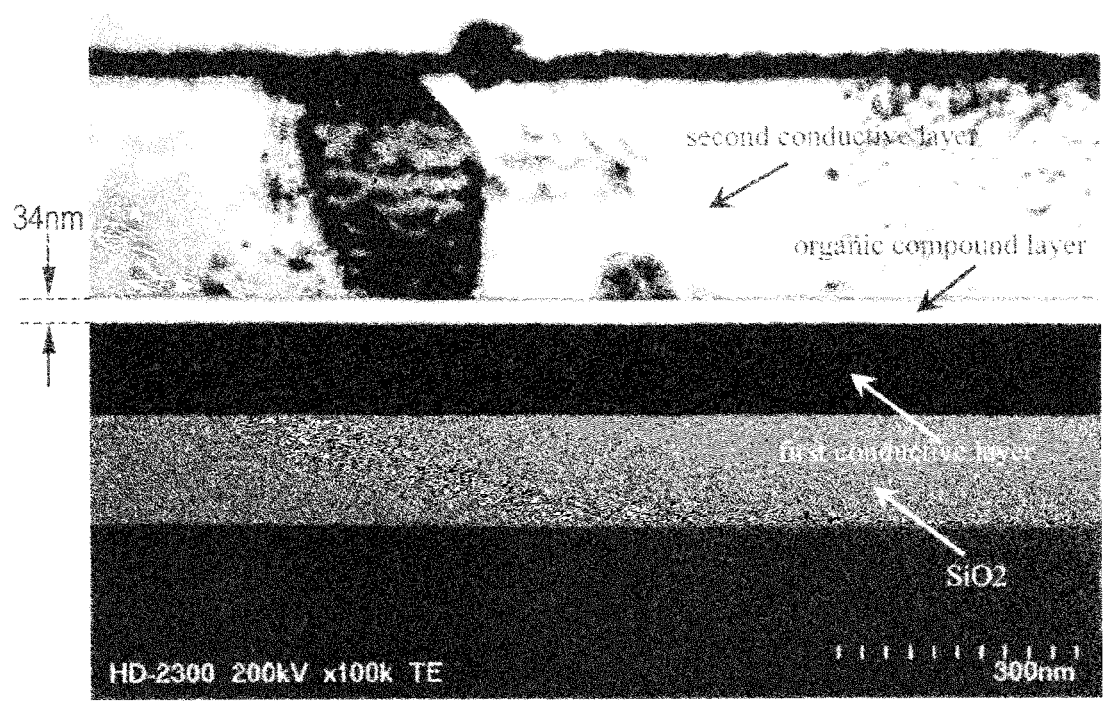
FIG. 23 is a cross-sectional TEM image of the organic memory element according to the present invention before the writing of data.

FIG. 19A shows an optical microscope image corresponding to an observed cross-section of the organic memory element after writing data, and FIG. 19B and FIGS. 20A and 20B show cross-sectional TEM images corresponding to FIG. 19A. In addition, FIG. 21A shows an optical microscope image corresponding to an observed cross-section after writing data, and FIGS. 22A and 22B show cross-sectional TEM images corresponding to FIG. 21. Further, for comparison, FIG. 23 shows a cross-sectional TEM image of the organic memory element before writing, where the film thickness of the film thickness is 34 nm. The magnification in FIG. 19B is ×30000, the magnification in FIGS. 20A and 20B is ×100000, and the magnification in FIGS. 22A and 22B and FIG. 23 is ×200000.

As shown in FIG. 23, the film thickness of the organic compound layer before writing is uniform, and is 34 nm here. FIG. 19B is a TEM image of Point (i) in FIG. 19A. As shown in FIG. 19A, a lot of projections are observed in a portion of the organic memory element after short-circuiting the organic memory element. It is FIG. 19B that shows a result of observing the portion including the projections. The righter portion in FIG. 19B corresponds to a portion near the center of the projections in FIG. 19A. Namely, it can be said that the projections in the organic memory element after short circuit are caused by change in thickness of the organic compound layer of the organic memory element.

Further, FIGS. 20A and 20B show observations of the organic memory element for the case of multiplying the magnification in FIG. 19B. It is to be noted that FIGS. 20A and 20B show different observed portions. The film thickness of the organic compound layer in the left edge is 90 nm in FIG. 20A while the film thickness of the organic compound layer in the left edge is 15 nm in FIG. 20B. As described above, in the organic compound layer of the organic memory element in which data is written, the thickness is partially varied, and it is thus determined that the distance between the electrodes is changed.

As shown FIG. 20A, it is believed that the projections in the organic memory element after writing data in FIG. 19A are caused because the film thickness of the organic compound layer of the organic memory element is changed when the voltage is applied to the organic memory element. As shown in FIG. 20A, the film thickness of the organic compound layer is thinner with being away from the portion including the projections. FIGS. 22A and 22B show observations of a portion between the projections (refer to Point (ii) in FIG. 21).

As shown in FIGS. 22A and 22B, it is determined that the organic memory element is short-circuited after applying the write voltage because the organic compound layer moves so that the first conductive layer and the second conductive layer come contact with each other. Strictly speaking, from the cross-sectional TEM images in FIGS. 22A and 22B, it is can be said that the film thickness of the organic compound layer is at least 5 nm or less at the boundary between the first conductive layer and the second conductive layer.

Embodiment 5

In the present embodiment, as for each of samples 1 to 6 as shown in FIGS. 27A to 27F, an organic memory element manufactured over a substrate, FIGS. 24A to 26B show results of measuring current-voltage characteristics when writing of data is carried out electrically into the organic memory elements. It is to be noted that writing is carried out here in such a way that a voltage is applied to the organic memory element to short-circuit the organic memory element.

In each of FIGS. 24A to 26B, the horizontal axis indicates a voltage, the vertical axis indicates a current density value, circular plots show a result of measuring current-voltage characteristics of the organic memory element before writing data, and square plots show a result of measuring current-voltage characteristics of the organic memory element after writing data. In addition, the size of each of the samples 1 to 6 in the horizontal plane is 2 mm×2 mm.

Figure 24A:
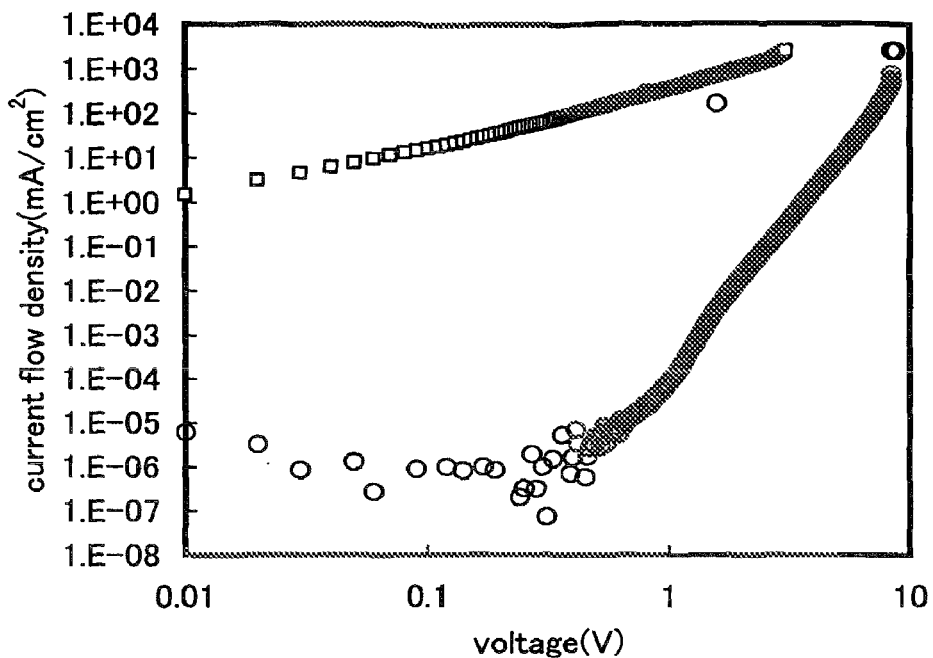
FIGS. 24A and 24B are diagrams showing current-voltage characteristics of organic memory elements according to the present invention.
Figure 27A:
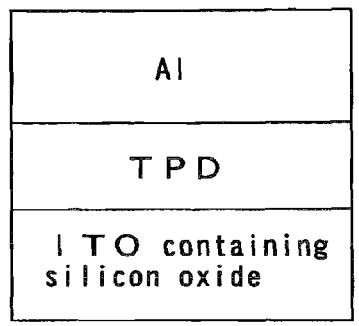
FIGS. 27A to 27F are diagrams illustrating the structures of organic memory elements according to the present invention as examples.

The sample 1 is an element for which a first conductive layer, a first organic compound layer, and a second conductive layer are sequentially stacked. Here, as shown in FIG. 27A, the first conductive layer, the first organic compound layer, and the second conducive layer are formed by using ITO containing silicon oxide, TPD and, aluminum, respectively. In addition, the first organic compound layer is formed so as to have a thickness of 50 nm. FIG. 24A shows a result of measuring current-voltage characteristics of the sample 1.

Figure 24B:
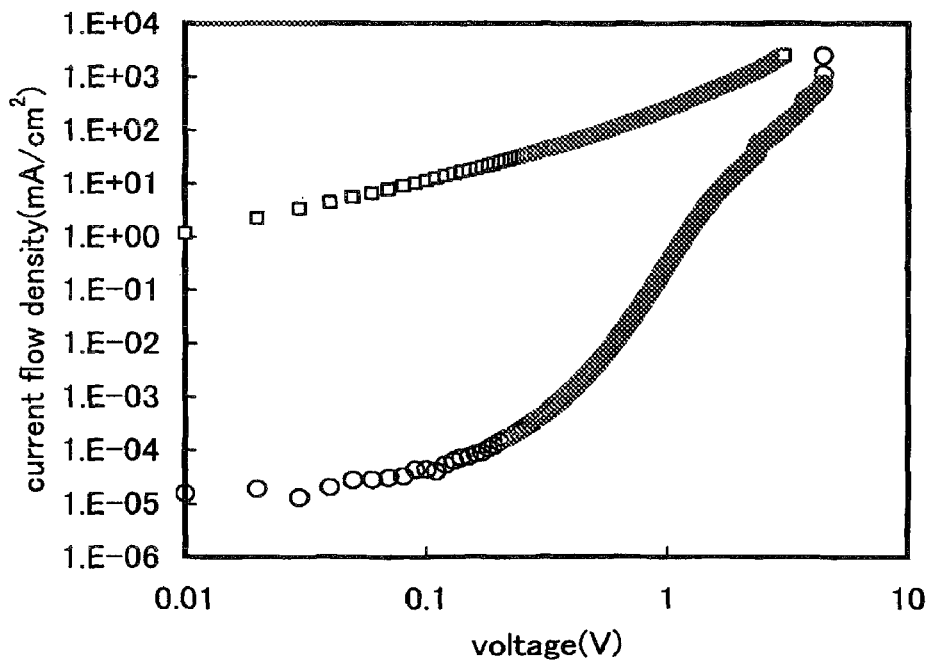
Figure 27B:
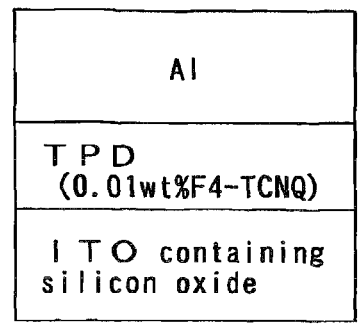

The sample 2 is an element for which a first conductive layer, a first organic compound layer, and a second conductive layer are sequentially stacked. Here, as shown in FIG. 27B, the first conductive layer, the first organic compound layer, and the second conductive layer are formed by using ITO containing silicon oxide, TPD doped with 2,3,5,6-tetrafluoro-7,7,8,8-tetracyanoquinodimethane (may be abbreviated as F4-TCNQ), aluminum, respectively. In addition, the first organic compound layer is formed so as to have a thickness of 50 nm and be doped with 0.01 wt % F4-TCNQ. FIG. 24B shows a result of measuring current-voltage characteristics of the sample 2.

Figure 25A:
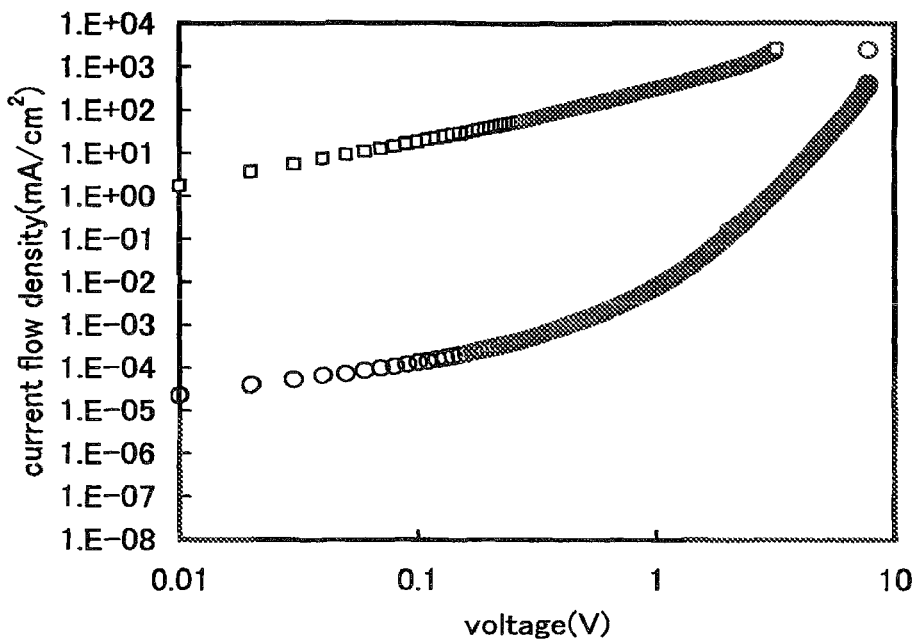
FIGS. 25A and 25B are diagrams showing current-voltage characteristics of organic memory elements according to the present invention.
Figure 27C:
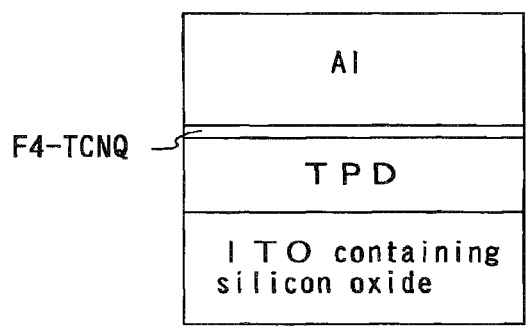

The sample 3 is an element for which a first conductive layer, a first organic compound layer, a second organic compound layer, and a second conductive layer are sequentially stacked. Here, as shown in FIG. 27C, the first conductive layer, the first organic compound layer, the second organic compound layer, and the second conductive layer are formed by using ITO containing silicon oxide, TPD, F4-TCNQ, and aluminum, respectively. In addition, the first organic compound layer is formed so as to have a thickness of 50 nm, and the second organic compound layer is formed so as to have a thickness of 1 nm. FIG. 25A shows a result of measuring current-voltage characteristics of the sample 3.

Figure 25B:
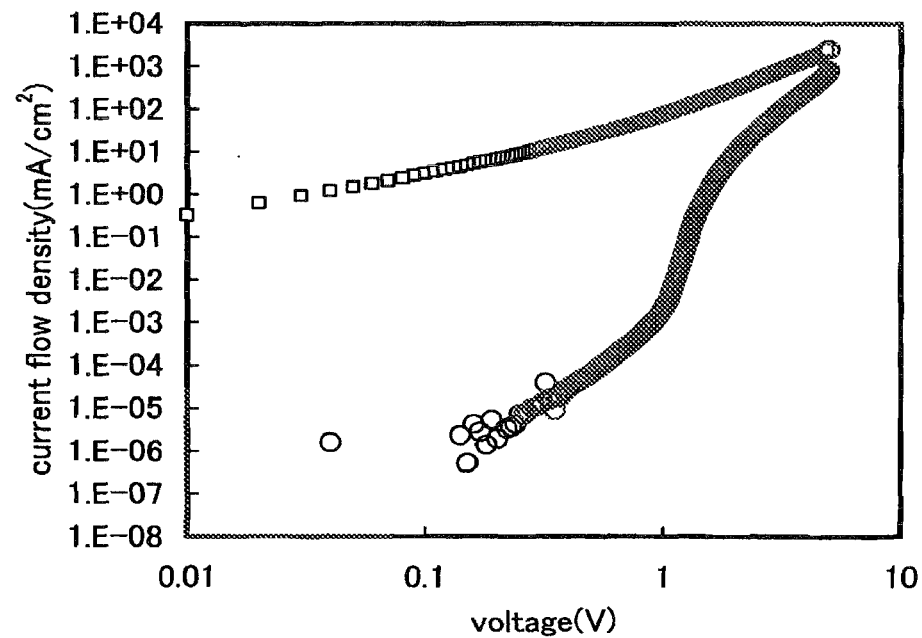
Figure 27D:
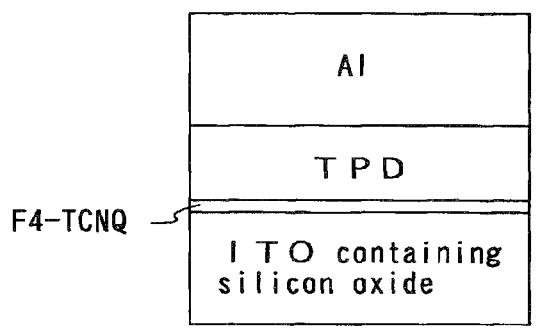

The sample 4 is an element for which a first conductive layer, a first organic compound layer, a second organic compound layer, and a second conductive layer are sequentially stacked. Here, as shown in FIG. 27D, the first conductive layer, the first organic compound layer, the second organic compound layer, and the second conductive layer are formed by using ITO containing silicon oxide, F4-TCNQ, TPD, and aluminum, respectively. In addition, the first organic compound layer is formed so as to have a thickness of 1 nm, and the second organic compound layer is formed so as to have a thickness of 50 nm. FIG. 25B shows a result of measuring current-voltage characteristics of the sample 4.

Figure 26A:
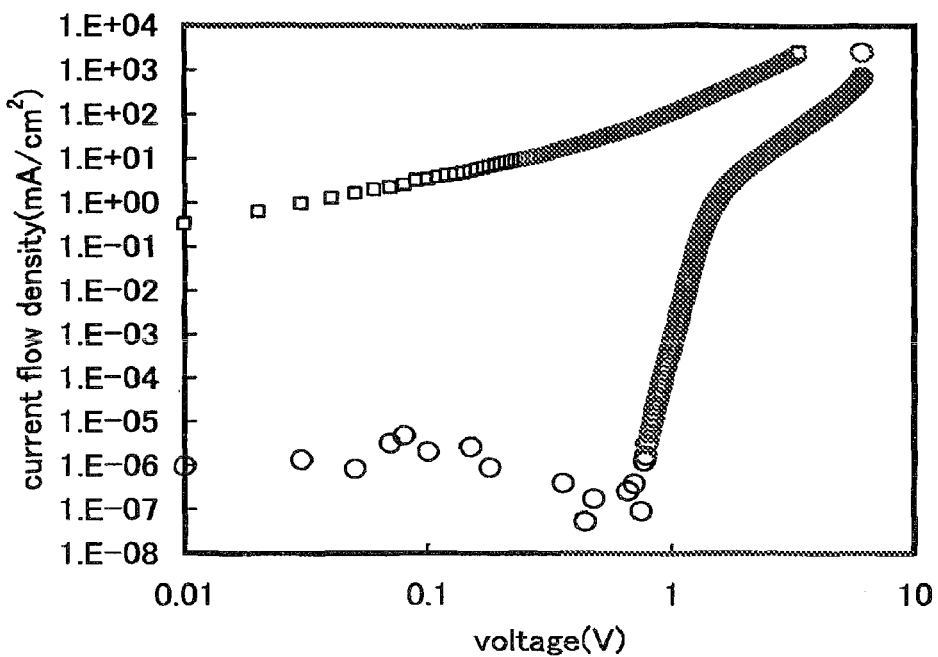
FIGS. 26A and 26B are diagrams showing current-voltage characteristics of organic memory elements according to the present invention.
Figure 27E:
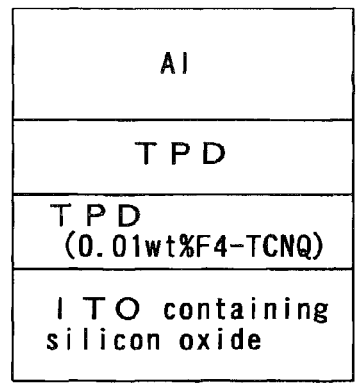

The sample 5 is an element for which a first conductive layer, a first organic compound layer, a second organic compound layer, and a second conductive layer are sequentially stacked. Here, as shown in FIG. 27E, the first conductive layer, the first organic compound layer, the second organic compound layer, and the second conductive layer are formed by using ITO containing silicon oxide, TPD doped with F4-TCNQ, TPD, and aluminum, respectively. In addition, the first organic compound layer is formed so as to have a thickness of 40 nm and be doped with 0.01 wt % F4-TCNQ, and the second organic compound layer is formed so as to have a thickness of 40 nm. FIG. 26A shows a result of measuring current-voltage characteristics of the sample 5.

Figure 26B:
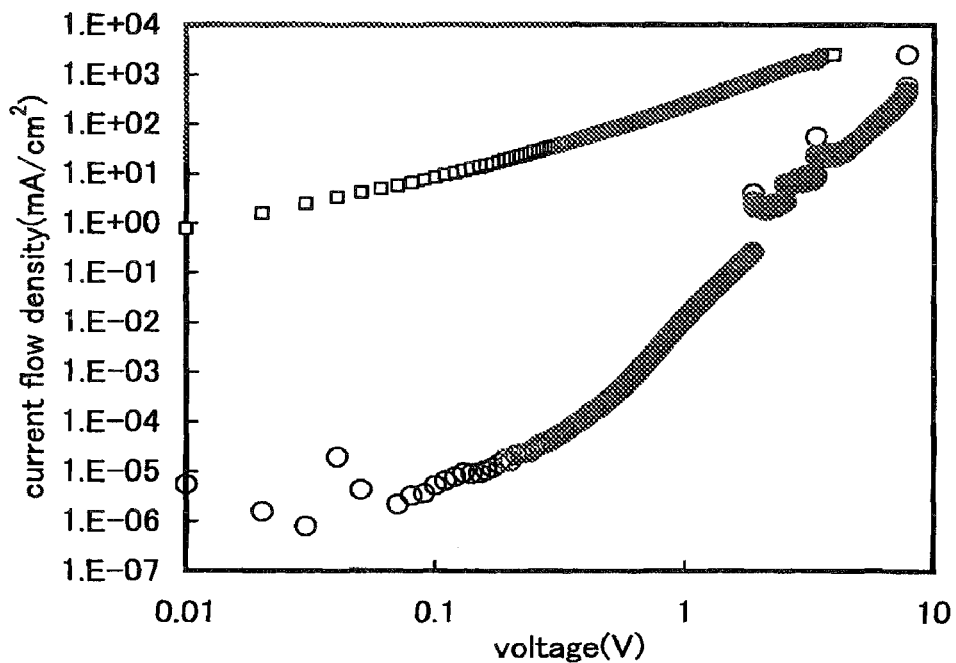
Figure 27F:
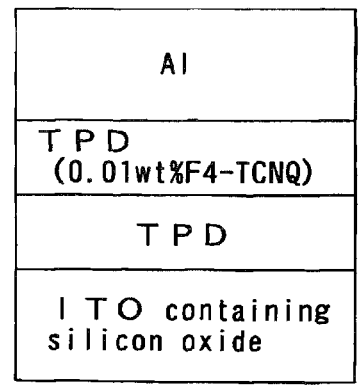

The sample 5 is an element for which a first conductive layer, a first organic compound layer, a second organic compound layer, and a second conductive layer are sequentially stacked. Here, as shown in FIG. 27F, the first conductive layer, the first organic compound layer, the second organic compound layer, and the second conductive layer are formed by using ITO containing silicon oxide, TPD, TPD doped with F4-TCNQ, and aluminum, respectively. In addition, the first organic compound layer is formed so as to have a thickness of 40 nm, and the second organic compound layer is formed so as to have a thickness of 10 nm and be doped with 0.01 wt % F4-TCNQ. FIG. 26B shows a result of measuring current-voltage characteristics of the sample 6.

The experiment results shown in FIGS. 24A to 26B also show substantial changes in current-voltage characteristics of the organic memory elements before writing data and after short-circuiting the organic memory elements. The organic memory elements of these samples have repeatability also in voltage that short-circuits each organic memory element, and the error is within 0.1 V.

Next, write voltages and characteristics before and after writing of the samples 1 to 6 are shown in FIG. 31.

In Table 1, a write voltage (V) indicates an applied voltage at short-circuiting each organic memory element. R(1V) indicates a value obtained by dividing a current density at applying 1 V to the organic memory element after writing by a current density at applying 1 V to the organic memory element before writing. Similarly, R(3V) indicates a value obtained by dividing a current density at applying 3 V to the organic memory element after writing by a current density at applying 3 V to the organic memory element before writing. Namely, R(1V) and R(3V) indicate changes in current density before and after writing into the organic memory element. It is determined that the difference in current density of the organic memory element is large, specifically 10 to the fourth power or more, in the case where the applied voltage is 1 V as compared with the case where the applied voltage is 3V.

Embodiment 6

In the present embodiment, a semiconductor device that has flexibility will be described with reference to FIGS. 28A and 28B and FIGS. 29A to 29C.

Figure 28A:
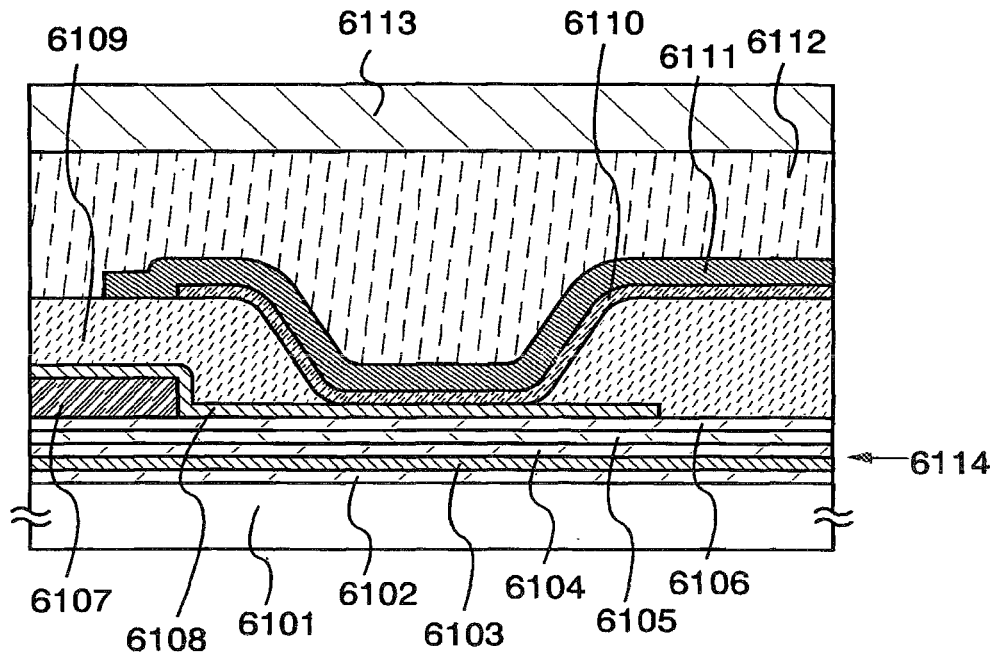
FIGS. 28A and 28B are diagrams illustrating a semiconductor device according to the present invention.
Figure 28B:
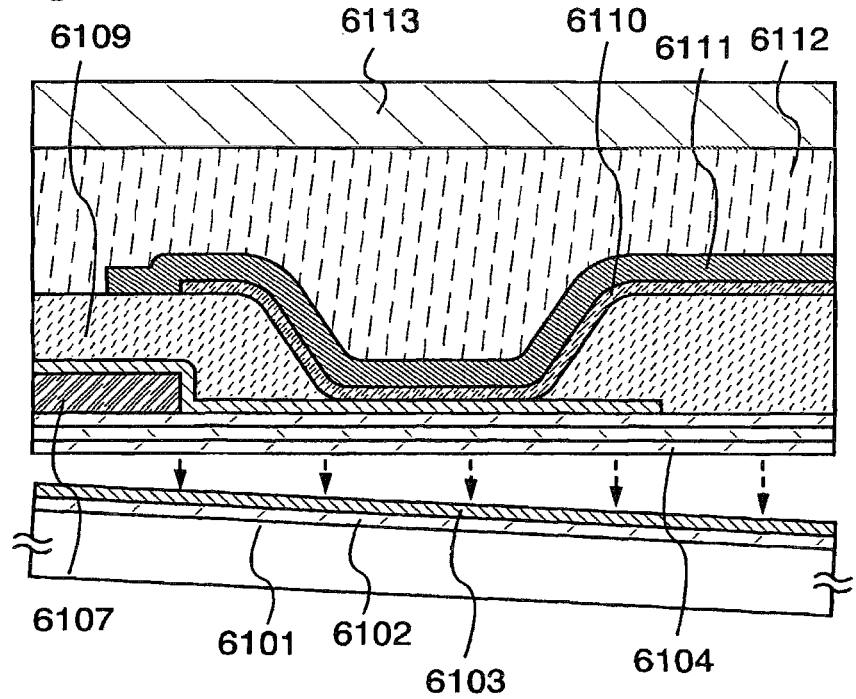

As shown in FIG. 28A, a SiON film 6102 that is 100 nm in film thickness is formed on a glass substrate 6101 by plasma CVD. Then, as a peeling layer, a tungsten film 6103 that is 30 nm in film thickness is formed by sputtering. Then, in contact with the tungsten film 6103 as a peeling layer, a $SiO_2$ film 6104 that is 200 nm in film thickness is formed by sputtering. A SiNO film 6105 that is 50 nm in film thickness, a SiON film 6106 that is 100 nm in film thickness, and an amorphous silicon film (not shown in the figure) that is 66 nm in film thickness are continuously formed by plasma CVD.

Next, the glass substrate 6101 is heated at 550° C. for 4 hours in an electric furnace. By the heating, a tungsten oxide layer (not shown in the figure) is formed at the interface between the tungsten film 6103 that serves as a peeling layer and the $SiO_2$ film 6104. In addition, the amorphous silicon film is crystallized, and a crystalline silicon film is thus formed.

Next, after dry etching of the crystalline semiconductor film, a conductive layer is formed in such away that a Ti film that is 60 nm in film thickness, a TiN film that is 40 nm in film thickness, an Al film that is 40 nm in film thickness, a Ti film that is 60 nm in film thickness, and a TiN film that is 40 nm in film thickness are stacked by sputtering. Then, a resist mask is formed by photolithography, and the conductive layer is etched with the resist mask as a protective film to form a wiring 6107.

Next, a Ti film that is 100 nm in film thickness is formed on the wiring 6107 and the SiON film 6106 by sputtering. Then, a resist mask is formed by photolithography, and the Ti film is etched by wet etching using HF with the resist mask as a protective film to form a first conductive layer 6108.

Next, after a photosensitive is applied and baked to form a polyimide layer 1.5 μm in film thickness, an insulating layer 6109 covering an edge portion of the first conductive layer 6108 is formed by exposure and development. At this point, a portion of the first conductive layer 6108 is exposed. Then, an organic compound layer 6110 that is 30 nm in thickness is formed by evaporation on the insulating layer 6109 and the exposed first conductive layer 6108, here, with the use of NPB. Then, a second conductive layer 6111 that is 200 nm in thickness is formed by evaporation, here, with the use of aluminum.

Next, an epoxy resin 6112 is applied, and then, baked at 110° C. for 30 minutes. Then, a flexible film 6113 is attached to the surface of the epoxy resin 6112. Then, an adhesive tape is attached to the glass substrate 6101. Then, the flexible film 6113 is bonded to the epoxy resin 6112 by heating at 120 to 150° C. Then, the glass substrate 6101 is disposed on a flat surface, an adhesive roller is attached to the surface of the flexible film 6113 by pressure bonding, and the layers including an organic element are peeled off at the interface (an arrow 6114 in FIG. 28A) between the tungsten film 6103 that serves as a peeling layer and the $SiO_2$ film 6104 (refer to FIG. 28B).

Figure 29A:
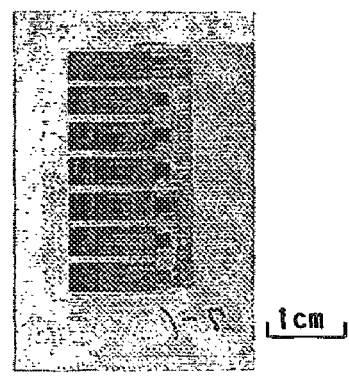
FIGS. 29A to 29C are diagrams illustrating the semiconductor device according to the present invention.
Figure 29B:
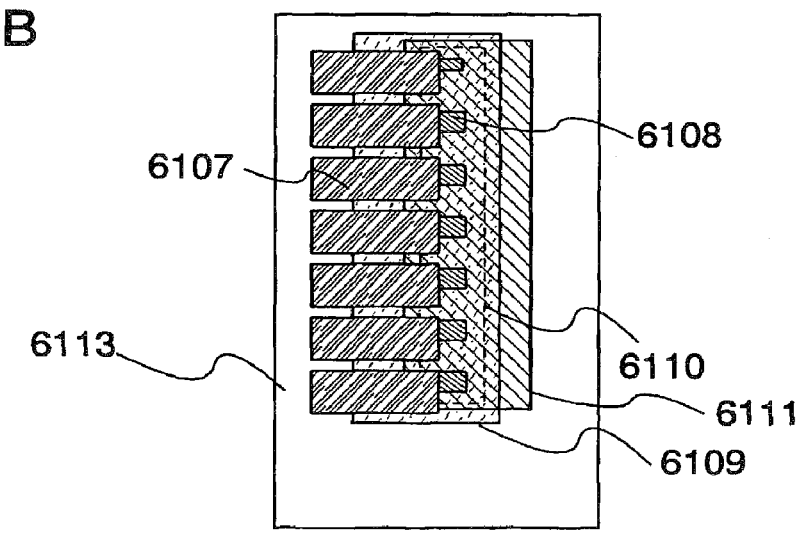
Figure 29C:
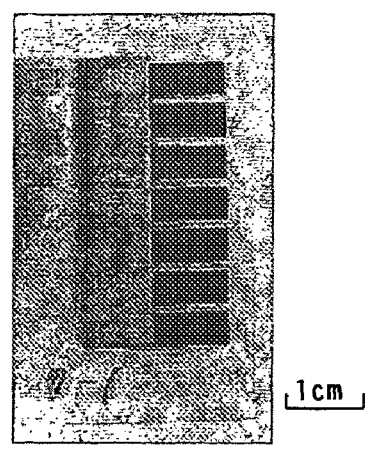

FIGS. 29A to 29C show photographs and a pattern diagram of the organic memory element thus peeled off from the glass substrate 6101.

FIG. 29A is a photograph of the organic memory element formed over the flexible film 6113, taken from the organic memory element side, that is, form the $SiO_2$ film side. FIG. 29B is a pattern diagram of FIG. 29A. The second conductive layer 6111, the insulating film 6109, the first conductive layer 6108 are stacked over the flexible film 6113, and the wiring 6107 connected to the first conductive layer 6108 is formed. It is to be noted that the organic compound layer 6110 on the surfaces of the insulating layer 6109 and the second conductive layer 6111 is indicated by a dashed line. Since the organic compound layer 6110 is not colored and has a thin film thickness, it is not possible to recognize the organic compound layer 6110 visually in FIG. 29A or 29C.

FIG. 29C is a photograph of the organic memory element shown in FIG. 29A, taken from the flexible film 6113 side.

As described above, a semiconductor device that has flexibility (a memory device or a memory) in which an organic memory element is provided over a flexible film can be manufactured.

Embodiment 7

Figure 30:
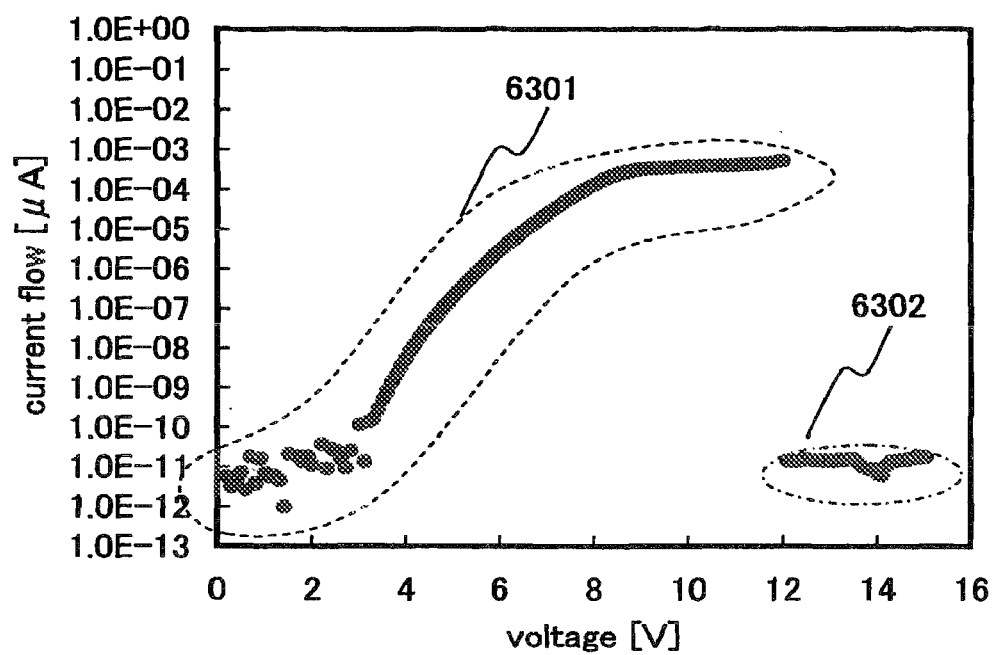
FIG. 30 is a diagram showing current-voltage characteristics of an organic memory element according to the present invention.

In the present embodiment, FIG. 30 shows a result of measuring current-voltage characteristics of an organic memory element for the case of applying a voltage to first and second conductive layers of the organic memory element to insulate the organic memory element in order to carry out writing.

The organic memory element is formed in such a way that the first conductive layer is formed on a glass substrate by sputtering, the surface of the first conductive layer is cleaned with a polyvinylalcohol-based porous body to remove dust on the surface, an organic compound layer that is 20 nm in thickness on the first conductive layer by evaporation, and the second conductive layer is formed on the organic compound layer by evaporation to be 200 nm in thickness. The first conductive layer, the organic compound layer, and the second conductive layer are formed by using titanium, $Alq_3$, and aluminum here, respectively. After that, an epoxy resin is applied and heated for sealing of the organic memory element. In this case, the size of the organic memory element in the horizontal plane is made to be 5 μm×5 μm.

In FIG. 30, the horizontal axis indicates a voltage, the vertical axis indicates a current value, plots 6301 show a result of measuring current-voltage characteristics of the organic memory element before writing data, and plots 6302 show a result of measuring current-voltage characteristics of the organic memory element immediately after writing. The write voltage in this case is 12 V, and the write current value is $5 \times 10^{-4}$ μA. In addition, the current value decreases immediately after writing to be $5 \times 10^{-12}$ to $3 \times 10^{-11}$ μA. This result indicates that data can be written by applying a voltage, and further, data can be read by a change in the current value of the organic memory element.

This application is based on Japanese Patent Application serial No. 2004-303595 field in Japan Patent Office on Oct. 18, 2004, the contents of which are hereby incorporated by reference.

Although the present invention has been fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein.

EXPLANATION OF REFERENCE

11: power supply circuit, 12: clock generation circuit, 13: data demodulation/modulation circuit, 14: control circuit, 15: interface circuit, 16: memory, 17: data bus, 18: antenna, 19: reader/writer, 20: semiconductor device, 21: memory cell, 22: memory cell array, 23: decoder, 24: decoder, 25: selector, 26: read/write circuit, 27: first conductive layer, 28: second conductive layer, 29: organic compound layer, 30: substrate, 31: flexible substrate, 32: laser light irradiation means, 33: insulating film, 34: insulating film, 35: group of elements, 36: substrate, 37: terminal area, 38: substrate, 39: conductive particle, 40: resin, 42: substrate, 43: flexible substrate, 44: semiconductor layer, 45: semiconductor layer, 46: resistive element, 47: differential amplifier, 51: roll, 52 heating means, 53: control means, 94: display portion, 95: reader/writer, 96: wireless tag, 97: article, 216: memory, 221: memory cell, 222: memory cell array, 223: decoder, 224: decoder, 225: selector, 226: read/write circuit, 232: laser irradiation system, 240: transistor, 241: organic memory element, 243: first conductive layer, 244: organic compound layer, 245: second conductive layer, 246: resistive element, 247: sense amplifier, 248: CMOS circuit, 249: insulating layer, 261: plots, 262: plots, 271: plots, 272: plots, 280: substrate, 281: integrated circuit, 282: memory, 1001: laser irradiation system, 1002: PC, 1003: laser oscillator, 1004: power supply, 1005: optical system, 1006: acousto-optic modulator, 1007: optical system, 1009: moving mechanism; 1011: driver, 1012: driver, 1013: autofocus mechanism, 2301: protective layer, 2302: group of elements, 2303: protective layer, 2304: antenna, 2305: drain electrode, 2306: source electrode, 2307: gate electrode, 6001: semiconductor device, 6002: memory cell array, 6003: portion of column decoder, 6004: portion of row decoder, 6005: read/write circuit, 6007: selector, 6008: selector, 6009: dashed line, 6011: plots, 6012: plots, 6013: plots, 6015: plots, 6016: plots, 6017: plots, 6101: glass substrate, 6102: SiON film, 6103: tungsten film, 6104: $SiO_2$ film, 6105: SiNO film, 6106: SiON film, 6107: wiring, 6108: first conductive layer, 6109: insulating layer, 6110: organic compound layer, 6111: second conductive layer, 6113: flexible film, 6114: arrow, 6301: plots, 6302: plots

What is claimed is:
1. A semiconductor device comprising:
a first conductive layer on a substrate;
a first organic compound layer over the first conductive layer;
a second organic compound layer over the first conductive layer;
a first insulating layer on the first conductive layer, the first insulating layer interposed between the first organic compound layer and the second organic compound layer;

a second conductive layer on the first organic compound layer;
a third conductive layer on the second organic compound layer; and
a second insulating layer on the second conductive layer, the third conductive layer, and the first insulating layer.

2. The semiconductor device according to claim 1,
wherein the second conductive layer is provided over the first conductive layer with the first organic compound layer interposed therebetween, and
wherein the third conductive layer is provided over the first conductive layer with the second organic compound layer interposed therebetween.

3. The semiconductor device according to claim 1, further comprising:
a first semiconductor layer interposed between the first conductive layer and the first organic compound layer; and
a second semiconductor layer interposed between the first conductive layer and the second organic compound layer,
wherein the first insulating layer is interposed between the first semiconductor layer and the second semiconductor layer.

4. The semiconductor device according to claim 1,
wherein a distance between the first conductive layer and the second conductive layer is arranged to change when a voltage is applied between the first conductive layer and the second conductive layer, and
wherein a distance between the first conductive layer and the third conductive layer is arranged to change when a voltage is applied between the first conductive layer and the third conductive layer.

5. The semiconductor device according to claim 4,
wherein the voltage is in the range between 5 and 15V.

6. The semiconductor device according to claim 1, further comprising a fourth conductive layer electrically connected to the second conductive layer.

7. The semiconductor device according to claim 1,
wherein the first organic compound layer and the second organic compound layer are provided on the same surface of the first conductive layer.

8. The semiconductor device according to claim 1,
wherein at least one of the first conductive layer and the second conductive layer has a light-transmitting property.

9. The semiconductor device according to claim 1,
wherein the first organic compound layer and the second organic compound layer include a same organic material.

10. The semiconductor device according to claim 1,
wherein the first organic compound layer has a first resistance which is irreversibly changed when a voltage is applied between the first conductive layer and the second conductive layer, and
wherein the second organic compound layer has a second resistance which is irreversibly changed when a voltage is applied between the first conductive layer and the third conductive layer.

11. The semiconductor device according to claim 1,
wherein the first organic compound layer and the second organic compound layer comprise one of an electron transporting material and a hole transporting material.

12. The semiconductor device according to claim 1,
wherein the first organic compound layer and the second organic compound layer have an electric conductivity that is $10^{-15}$ S/cm or more and $10^{-3}$ S/cm or less.

13. The semiconductor device according to claim 1,
wherein the first organic compound layer and the second organic compound layer have a film thickness of 5 to 60 nm.

14. The semiconductor device according to claim 1,
wherein the first organic compound layer and the second organic compound layer comprise a material having an electric resistance which is changed by light irradiation.

15. The semiconductor device according to claim 1,
wherein the first organic compound layer and the second organic compound layer comprise a material having an electric conductivity which is changed by laser light irradiation.

16. The semiconductor device according to claim 1, further comprising at least one of a power supply circuit, a clock generation circuit, a data demodulation/modulation circuit, and an interface circuit.

17. The semiconductor device according to claim 1,
wherein the substrate is a glass substrate.

18. The semiconductor device according to claim 1,
wherein the substrate is a flexible substrate.

19. The semiconductor device according to claim 1,
wherein at least one of the first conductive layer and the second conductive layer comprises titanium.

20. A semiconductor device comprising:
a transistor on a substrate;
a first conductive layer over the transistor;
a first organic compound layer over the first conductive layer;
a second organic compound layer over the first conductive layer;
a first insulating layer on the first conductive layer, the first insulating layer interposed between the first organic compound layer and the second organic compound layer;
a second conductive layer on the first organic compound layer;
a third conductive layer on the second organic compound layer; and
a second insulating layer on the second conductive layer, the third conductive layer, and the first insulating layer.

21. The semiconductor device according to claim 20,
wherein the transistor is a thin film transistor.

22. The semiconductor device according to claim 20,
wherein the second conductive layer is provided over the first conductive layer with the first organic compound layer interposed therebetween, and
wherein the third conductive layer is provided over the first conductive layer with the second organic compound layer interposed therebetween.

23. The semiconductor device according to claim 20, further comprising:
a first semiconductor layer interposed between the first conductive layer and the first organic compound layer; and
a second semiconductor layer interposed between the first conductive layer and the second organic compound layer,
wherein the first insulating layer is interposed between the first semiconductor layer and the second semiconductor layer.

24. The semiconductor device according to claim 20,
wherein a distance between the first conductive layer and the second conductive layer is arranged to change when a voltage is applied between the first conductive layer and the second conductive layer, and wherein a distance between the first conductive layer and the third conductive layer is arranged to change when a voltage is applied between the first conductive layer and the third conductive layer.

25. The semiconductor device according to claim 24, wherein the voltage is in the range between 5 and 15V.

26. The semiconductor device according to claim 20, further comprising a fourth conductive layer electrically connected to the second conductive layer.

27. The semiconductor device according to claim 20, wherein the first organic compound layer and the second organic compound layer are provided on the same surface of the first conductive layer.

28. The semiconductor device according to claim 20, wherein at least one of the first conductive layer and the second conductive layer has a light-transmitting property.

29. The semiconductor device according to claim 20, wherein the first organic compound layer and the second organic compound layer include a same organic material.

30. The semiconductor device according to claim 20, wherein the first organic compound layer has a first resistance which is irreversibly changed when a voltage is applied between the first conductive layer and the second conductive layer, and
wherein the second organic compound layer has a second resistance which is irreversibly changed when a voltage is applied between the first conductive layer and the third conductive layer.

31. The semiconductor device according to claim 20, wherein the first organic compound layer and the second organic compound layer comprise one of an electron transporting material and a hole transporting material.

32. The semiconductor device according to claim 20, wherein the first organic compound layer and the second organic compound layer have an electric conductivity that is $10^{-15}$ S/cm or more and $10^{-3}$ S/cm or less.

33. The semiconductor device according to claim 20, wherein the first organic compound layer and the second organic compound layer have a film thickness of 5 to 60 nm.

34. The semiconductor device according to claim 20, wherein the first organic compound layer and the second organic compound layer comprise a material having an electric resistance which is changed by light irradiation.

35. The semiconductor device according to claim 20, wherein the first organic compound layer and the second organic compound layer comprise a material having an electric conductivity which is changed by laser light irradiation.

36. The semiconductor device according to claim 20, further comprising at least one of a power supply circuit, a clock generation circuit, a data demodulation/modulation circuit, and an interface circuit.

37. The semiconductor device according to claim 20, wherein the substrate is a glass substrate.

38. The semiconductor device according to claim 20, wherein the substrate is a flexible substrate.

39. The semiconductor device according to claim 20, wherein at least one of the first conductive layer and the second conductive layer comprises titanium.

* * * * *

UNITED STATES PATENT AND TRADEMARK OFFICE
CERTIFICATE OF CORRECTION

PATENT NO. : 8,223,531 B2
APPLICATION NO. : 13/151299
DATED : July 17, 2012
INVENTOR(S) : Ryoji Nomura et al.

It is certified that error appears in the above-identified patent and that said Letters Patent is hereby corrected as shown below:

At column 2, line 33, "fines" should be --lines--;

At column 2, line 67, "wad" should be --word--;

At column 10, line 28, "With" should be --with--;

At column 14, line 15, "vp0" should be --Vp0--;

At column 14, line 53, "devfces" should be --devices--;

At column 20, line 53, "100 inn" should be --100 nm--;

At column 23, line 44, "short-cirduit" should be --short-circuit--.

Signed and Sealed this
Twenty-seventh Day of November, 2012

David J. Kappos
*Director of the United States Patent and Trademark Office*